United States Patent
Horio et al.

(10) Patent No.: US 7,605,403 B2
(45) Date of Patent: Oct. 20, 2009

(54) SEMICONDUCTOR LIGHT-EMITTING DEVICE AND FABRICATION METHOD OF THE SAME

(75) Inventors: Naochika Horio, Tokyo (JP); Masahiko Tsuchiya, Tokyo (JP); Munehiro Kato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 246 days.

(21) Appl. No.: 11/125,142

(22) Filed: May 10, 2005

(65) Prior Publication Data

US 2005/0253156 A1   Nov. 17, 2005

(30) Foreign Application Priority Data

May 11, 2004   (JP)   ............................... 2004-141380

(51) Int. Cl.
    *H01L 27/15*   (2006.01)
(52) U.S. Cl. .................. 257/91; 257/88; 257/E33.057; 257/E33.066
(58) Field of Classification Search ............. 257/88–91, 257/99, E33.057, 92, 93
    See application file for complete search history.

(56) References Cited

U.S. PATENT DOCUMENTS

| | | | |
|---|---|---|---|
| 6,066,861 A | 5/2000 | Hohn et al. | 257/99 |
| 6,245,259 B1 | 6/2001 | Hohn et al. | 252/301.36 |
| 6,277,301 B1 | 8/2001 | Hohn et al. | 252/301.36 |
| 6,576,930 B2 | 6/2003 | Reeh et al. | 257/98 |
| 6,592,780 B2 | 7/2003 | Hohn et al. | 252/301.36 |
| 6,613,247 B1 | 9/2003 | Hohn et al. | 252/301.36 |
| 6,669,866 B1 | 12/2003 | Kummer et al. | 252/301.4 R |
| 6,693,306 B2 * | 2/2004 | Chen et al. | 257/99 |
| 6,774,401 B2 | 8/2004 | Nakada et al. | 257/82 |
| 6,809,342 B2 | 10/2004 | Harada | 257/79 |
| 6,812,500 B2 | 11/2004 | Reeh et al. | 257/98 |
| 2002/0093023 A1* | 7/2002 | Camras et al. | 257/94 |
| 2005/0194605 A1* | 9/2005 | Shelton et al. | 257/99 |

FOREIGN PATENT DOCUMENTS

| | | |
|---|---|---|
| JP | 10-190065 | 12/1996 |
| JP | 2914065 | 4/1999 |
| JP | 2001-127346 | 10/1999 |
| JP | 2001-196639 | 1/2000 |
| JP | 2001-210872 | 1/2000 |
| JP | 2001-345483 | 5/2000 |
| JP | 3136672 | 12/2000 |
| JP | 2002-270905 | 9/2002 |
| JP | 2004-056075 | 12/2002 |
| JP | 2003-110148 | 4/2003 |

* cited by examiner

*Primary Examiner*—Allan R. Wilson
(74) *Attorney, Agent, or Firm*—Cermak Kenealy Vaidya & Nakajima LLP

(57) ABSTRACT

A semiconductor light-emitting device can include a nitride semiconductor light-emitting layer and can supply a current to an entire light-emitting region quickly and efficiently to output high-intensity light. The semiconductor light-emitting device can include: a transparent substrate; a first conductivity type nitride semiconductor layer; a nitride semiconductor light-emitting layer; a second conductivity type nitride semiconductor layer; a notch region that cuts the second conductivity type nitride semiconductor layer and the nitride semiconductor light-emitting layer and exposes the first conductivity type nitride semiconductor layer, to define mesa active regions and a mesa electrode drawing region; an electrode for the first conductivity type; an ohmic electrode for the second conductivity type; and a supporting substrate including connecting members for the first and second conductivity types.

10 Claims, 14 Drawing Sheets

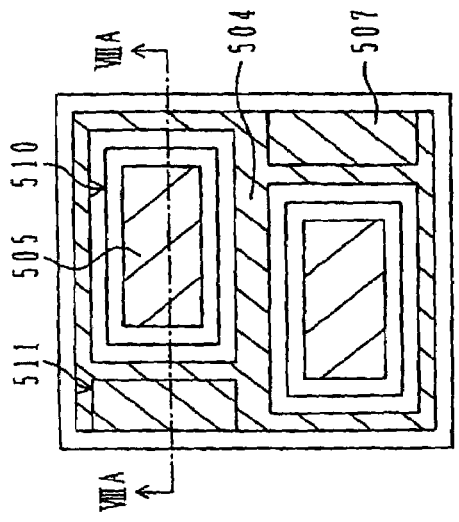
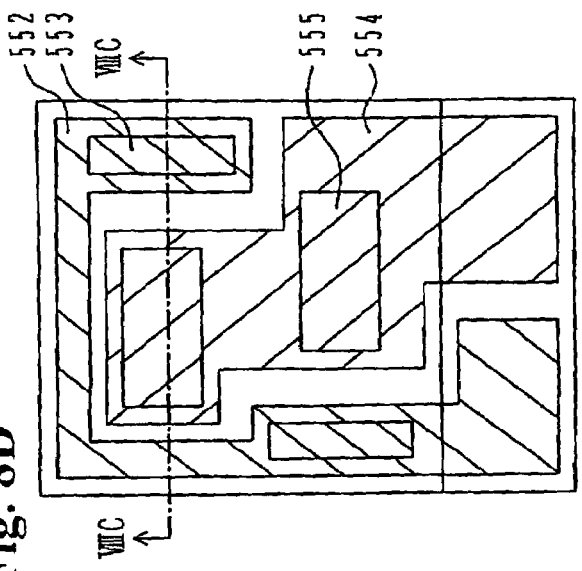
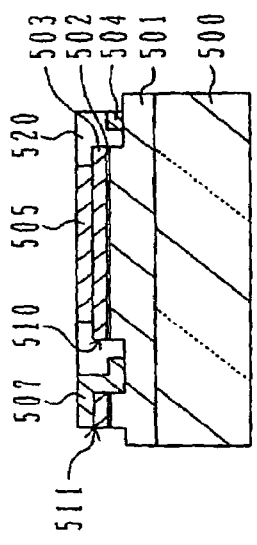
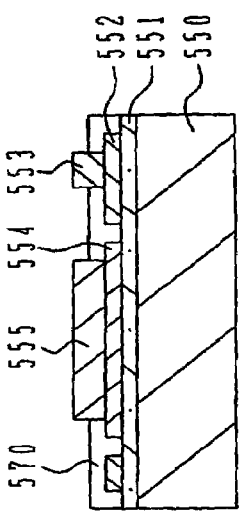
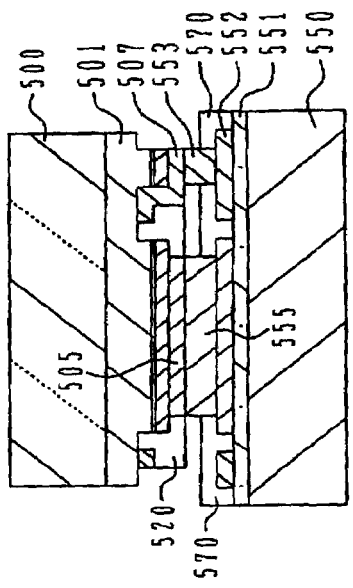

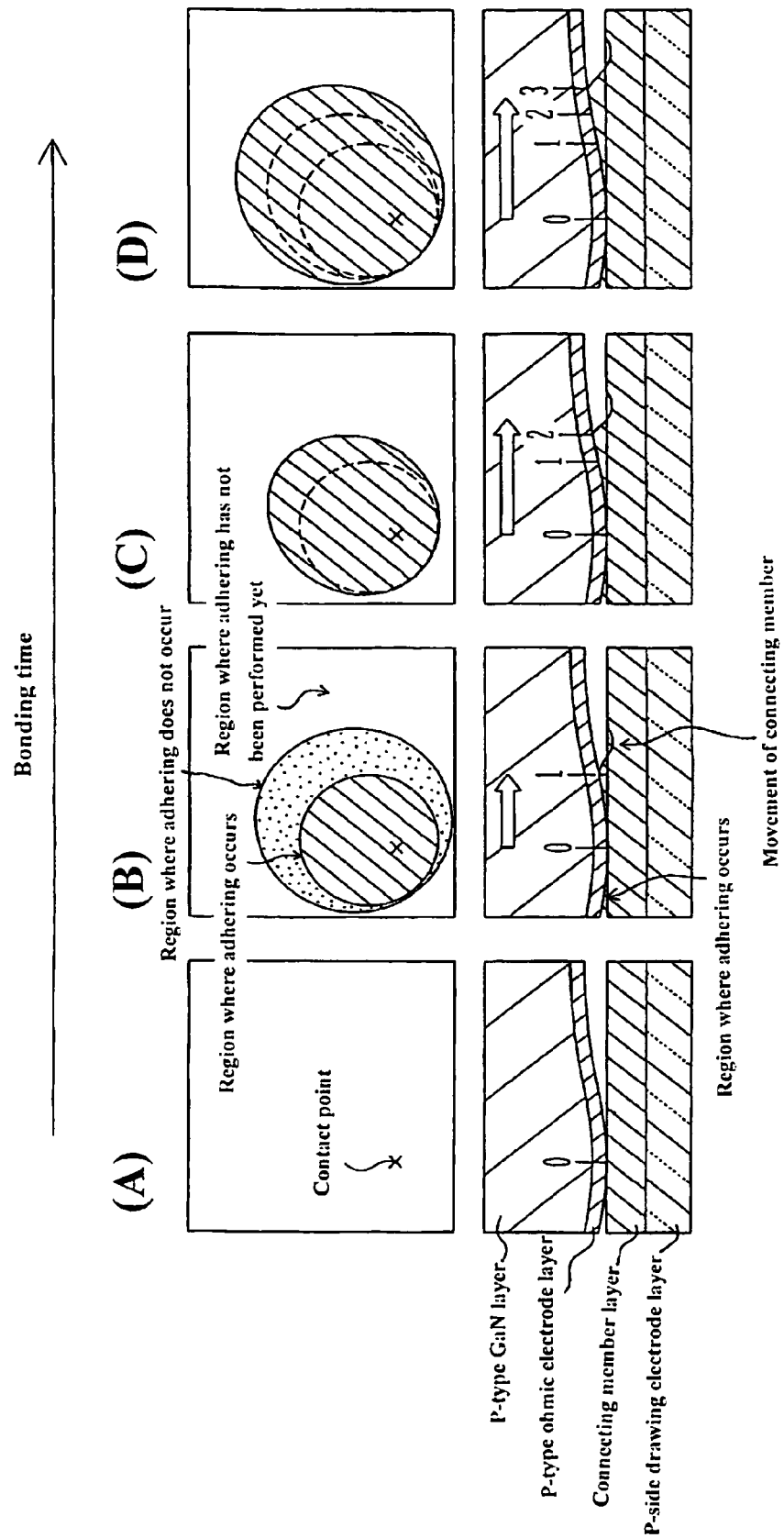
Fig. 9 Bonding process

Fig. 10 Load and Bonding area
(A) Small load
(B) Appropriate load
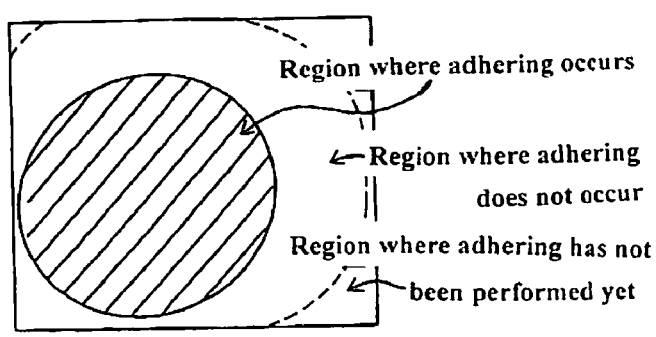
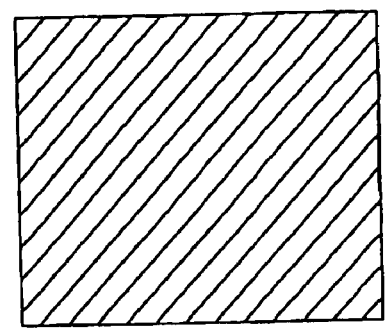
Small load
Appropriate load
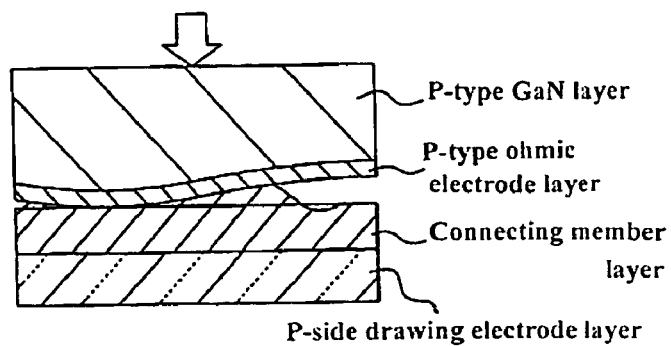
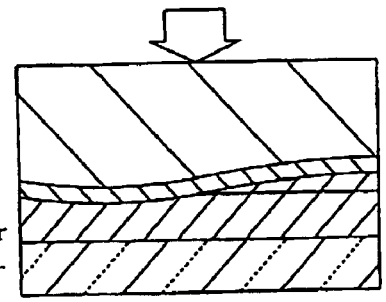
P-type GaN layer
P-type ohmic electrode layer
Connecting member layer
P-side drawing electrode layer

Fig. 11
Designed adhering area and actual adhering area
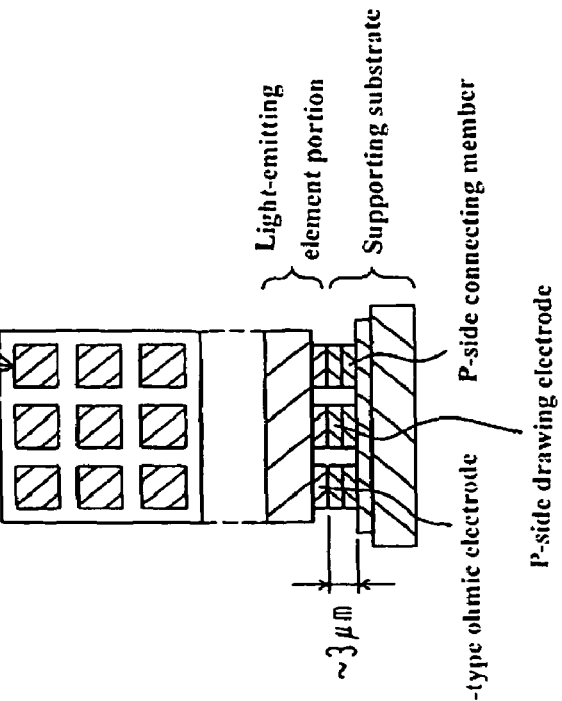
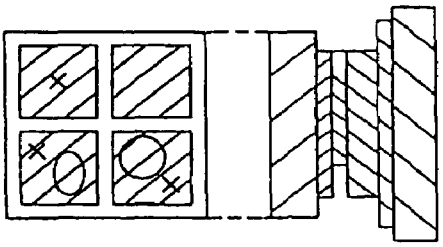
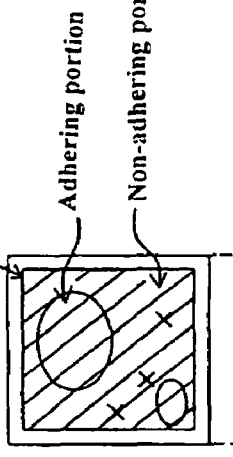
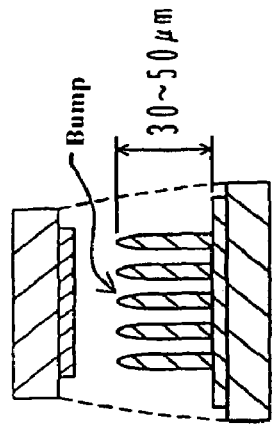

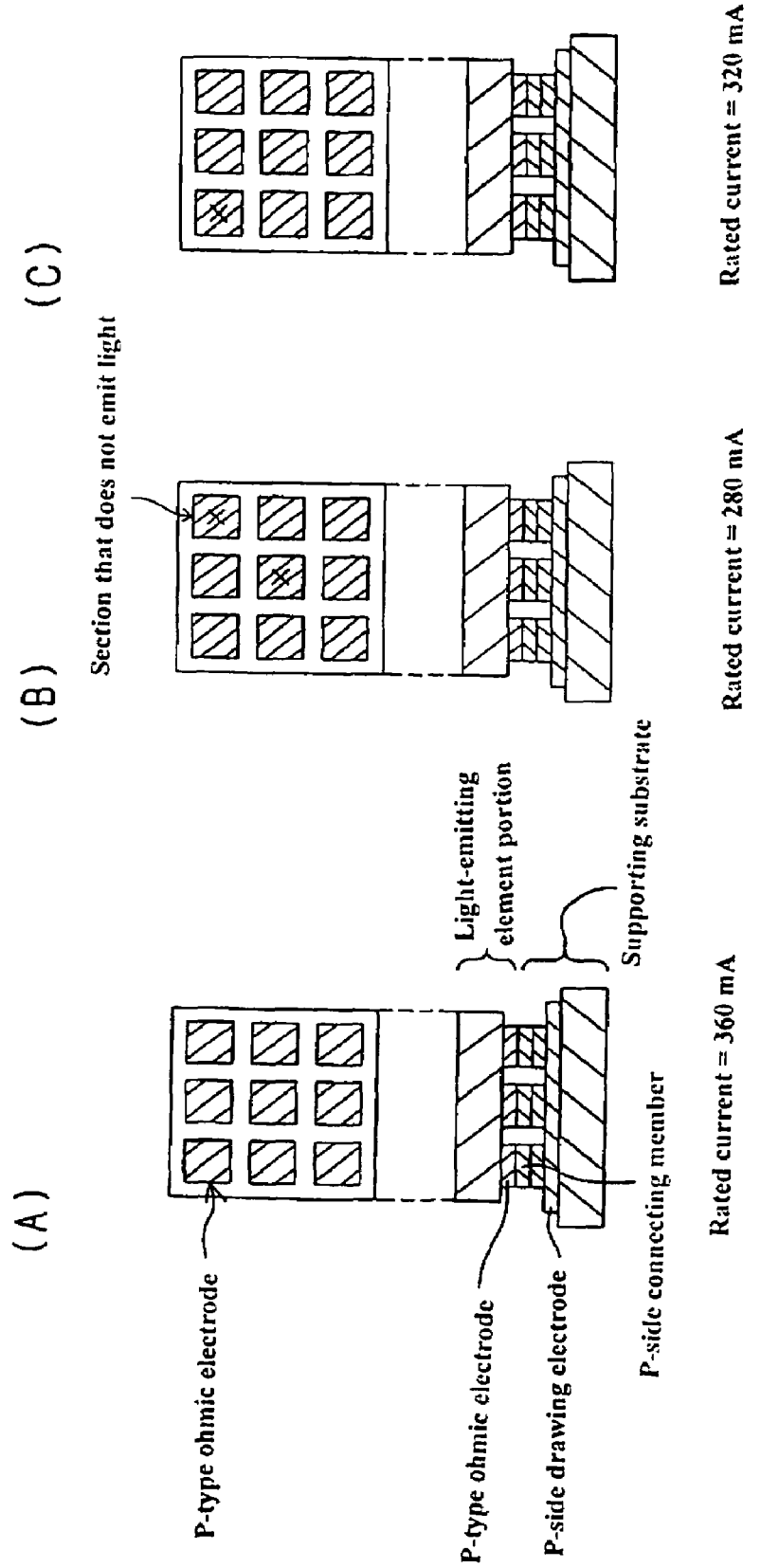

Fig. 13 Contact angle and surface tension (interfacial tension)

(A) Au and bonding member

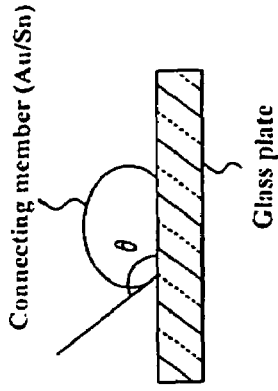

(B) Glass and bonding member

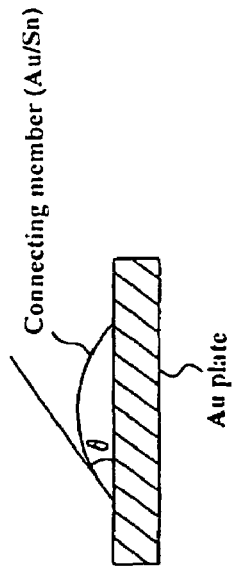

(C) Contact angle and surface tension (interfacial tension)

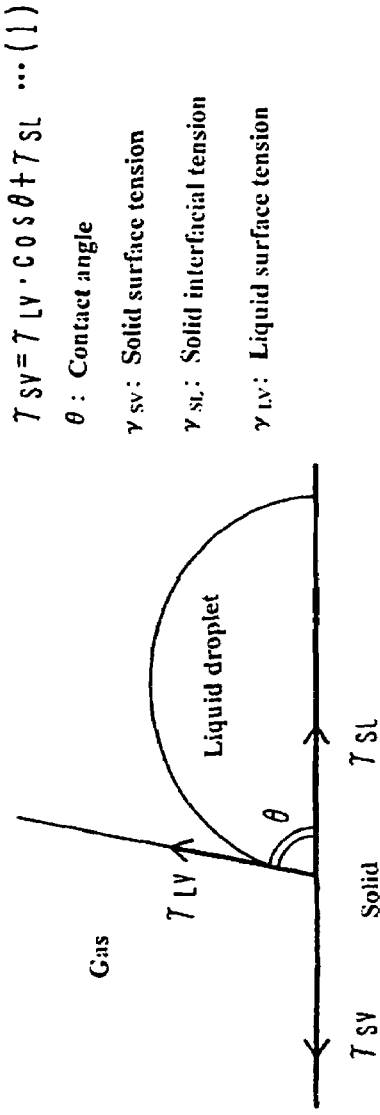

$$\gamma_{SV} = \gamma_{LV} \cdot \cos\theta + \gamma_{SL} \quad \cdots (1)$$

$\theta$ : Contact angle
$\gamma_{SV}$: Solid surface tension
$\gamma_{SL}$: Solid interfacial tension
$\gamma_{LV}$: Liquid surface tension

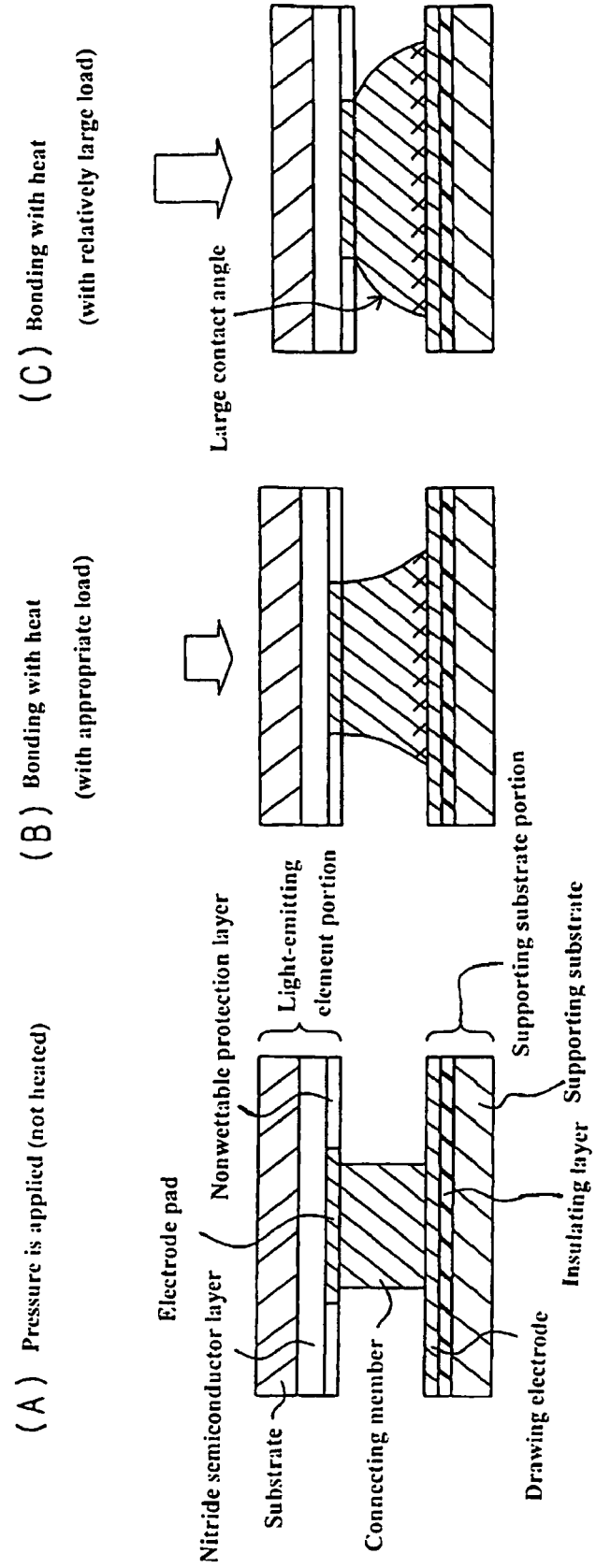

SEMICONDUCTOR LIGHT-EMITTING DEVICE AND FABRICATION METHOD OF THE SAME

This application claims the priority benefit under 35 U.S.C. § 119 of Japanese Patent Application No. 2004-141380 filed on May 11, 2004, which is hereby incorporated by reference.

BACKGROUND OF THE INVENTION

1. Field of the Invention

The invention relates to a semiconductor light-emitting device and a fabrication method of the same. More particularly, the invention relates to a semiconductor light-emitting device in which a semiconductor light-emitting structure can be formed on a transparent single-crystal substrate such as a sapphire substrate, and a fabrication method of the same.

2. Description of the Related Art

A semiconductor light-emitting device for emitting blue light is widely known which uses nitride semiconductors such as GaN, GaAlN, InGaN, and InAlGaN (hereinafter, referred to as GaN compound semiconductors). A blue light-emitting diode (LED) that is covered with a wavelength conversion layer containing a fluorescent material can emit white light that can be used for lighting.

A GaN semiconductor layer is usually formed or grown on a sapphire substrate that is an insulating transparent single-crystal substrate. Thus, it is typically necessary to draw electrodes of the LED from a surface of the LED that is opposite to the sapphire substrate. Light is emitted in all directions. Light output from the LED can also be obtained from the sapphire substrate side.

In recent years, output capabilities of LEDs has increased and the market for LEDs has expanded from a display field where the LED is conventionally used to fields of lighting such as special lighting, general lighting, and automotive lighting. Simultaneously, the die size of LEDs has increased from about 300 μm square to 1 mm or 2 mm square. However, problems of uneven emission of light, impairment of current supply, heat generation in the LED, and the like have become obvious with the increase of the die size.

Japanese Patent Laid-Open Publication No. 2002-270905 proposes that a plurality of light-emitting elements be formed on a sapphire substrate and that the sapphire substrate with the light-emitting elements be mounted via bumps on a single sub-mounting element that is formed by a silicon substrate. Accumulation of a plurality of light-emitting elements can provide a large amount of light emission. The use of a silicon substrate that has better heat dissipation property than a sapphire substrate accelerates heat radiation, thereby preventing lowering of the luminous efficiency caused by heat generation. Thus, the luminous efficiency can be improved and an excellent light source for lighting can be obtained.

Japanese Patent Laid-Open Publication No. 2003-110148 proposes another semiconductor light-emitting device. In this semiconductor light-emitting device, a sapphire substrate on which a semiconductor light emitting device is formed is mounted on a mounting board with bumps for electric conduction and electrically-insulated dummy bumps interposed between the sapphire substrate and the mounting board, thereby improving the heat dissipation property.

Japanese Patent No. 3136672 proposes the following structure. An i-type GaN semiconductor layer doped with p-type impurities is formed on an n-type GaN semiconductor layer. One of the electrodes is formed on a surface of the i-type GaN semiconductor layer and a region surrounding the one electrode is etched. The other electrode is formed such that it surrounds the one electrode in all circumferences of that structure including side faces. In that structure, a current flowing between the electrodes is made to be uniform and light that is emitted laterally is also reflected so as to exit.

Japanese Patent No. 2914065 proposes a GaN light-emitting diode in which an insulating protection layer is formed on a semiconductor layer between a pair of electrode layers, thereby preventing a short-circuit caused by silver paste that is used for connecting a lead electrode.

SUMMARY OF THE INVENTION

In accordance with an aspect of the invention, a semiconductor light-emitting device can include a nitride semiconductor light-emitting layer, can supply a current to an entire light-emitting region quickly, and can efficiently output high-intensity light. In accordance with another aspect of the invention, a fabrication method of a semiconductor light-emitting device is disclosed.

In accordance with another aspect of the invention, a semiconductor light-emitting device can include a nitride semiconductor light-emitting layer and can efficiently emit light from a large light-emitting region. This aspect of the invention includes a fabrication method for the semiconductor light-emitting device.

According to another aspect of the invention, a semiconductor light-emitting device can be provided that includes: a transparent single-crystal substrate; a first conductivity type nitride semiconductor layer formed above the transparent single-crystal substrate; a nitride semiconductor light-emitting layer formed above the first conductivity type nitride semiconductor layer; a second conductivity type nitride semiconductor layer formed above the nitride semiconductor light-emitting layer, the second conductivity type being opposite to the first conductivity type; a notch region having a depth such that the notch region cuts the second conductivity type nitride semiconductor layer and the nitride semiconductor light-emitting layer and exposes the first conductivity type nitride semiconductor layer, the notch region defining a plurality of mesa active regions and a mesa electrode drawing region; an electrode for the first conductivity type including an ohmic electrode portion for the first conductivity type and a pad electrode portion for the first conductivity type, the ohmic electrode portion for the first conductivity type being formed on a first conductivity type region that is exposed in the notch region surrounding the plurality of mesa active regions, the pad electrode portion for the first conductivity type continuously extending from the ohmic electrode portion for the first conductivity type to a region on the mesa electrode drawing region; an ohmic electrode for the second conductivity type formed on the second conductivity type nitride semiconductor layer in each of the plurality of mesa active regions; and a supporting substrate arranged to be opposed to the transparent single-crystal substrate, the supporting substrate including a conductive connecting member for the first conductivity type that is opposed to and connected to the pad electrode portion for the first conductivity type, and a conductive connecting member for the second conductivity type that is opposed to and connected to each ohmic electrode for the second conductivity type.

In accordance with another aspect, the plurality of mesa active regions may be arranged in a matrix in a light-emitting region, and the mesa electrode drawing region may be arranged in a plurality of regions outside the light-emitting region.

Furthermore, each of the mesa active regions may have a rectangular shape.

In accordance with another aspect, the notch region may include a plurality of trenches. The trenches may be divided in two groups respectively formed in two directions crossing each other.

Furthermore, in accordance with another aspect the light-emitting region may have a rectangular shape. The mesa electrode drawing region may be arranged outside the rectangular light-emitting region and in a region other than regions corresponding to central parts of sides of the rectangular light-emitting region.

In accordance with another aspect, the mesa electrode drawing region may be an L-shaped region arranged at the outside of each corner of the rectangular light-emitting region.

In accordance with another aspect, the mesa electrode drawing region may have a rectangular planer shape. Furthermore, the mesa electrode drawing region may be arranged outside a region other than regions corresponding to the central parts of the sides of the rectangular light-emitting region, and regions near each corner of the rectangular light-emitting region.

Still further, the supporting substrate may include a first wiring corresponding to the first conductivity type nitride semiconductor layer and a second wiring corresponding to the second conductivity type nitride semiconductor layer. Here, the second wiring can connect the plurality of mesa active regions of the second conductivity type nitride semiconductor layer with each other. The second wiring may be drawn from a region facing towards any of the central parts of sides of the rectangular light-emitting region to a region outside that corresponding to the light-emitting region.

In accordance with another aspect, the mesa active regions and the mesa electrode drawing region may be arranged on the transparent substrate in a matrix.

In accordance with another aspect, the notch region may include a plurality of notch regions that are divided in two groups respectively formed in two directions crossing each other.

In accordance with another aspect, the mesa active regions and the mesa electrode drawing region may have the same planar shape. Here, the mesa active regions and the mesa electrode drawing region may be arranged in a matrix within a rectangular region. Furthermore, the mesa electrode drawing region may be arranged at a corner of the rectangular region.

In accordance with another aspect, the electrode for the first conductivity type may include an alignment mark formed as a region in which no electrode is selectively formed. Here, the alignment mark may include at least two straight line sections respectively arranged in two directions crossing each other. Alternatively, the alignment mark may be a polygon or a circle having a diameter of 100 μm to 500 μm.

In accordance with another aspect, an area of each mesa active region may be in the range of 0.01 $mm^2$ to 0.2 $mm^2$.

Furthermore, in accordance with another aspect the conductive connection member may have a thickness of 0.3 μm to 3 μm.

In accordance with another aspect, the conductive connection member of the supporting substrate may include a metal layer with a high affinity to solder or eutectic bonding.

In accordance with another aspect, the semiconductor light-emitting device may further include a protection layer provided above the transparent substrate in such a manner that the pad electrode portion for the first conductivity type and the ohmic electrode portion for the second conductivity type can be exposed and the ohmic electrode portion for the first conductivity type at the notch region can be covered therewith. Here, the protection layer can prevent the melted connecting member from getting wet.

In accordance with another aspect, the supporting substrate may include a protection layer provided to surround the conductive connecting member for the first conductivity type and the conductive connecting member for the second conductivity type. Here, the protection layer can prevent the melted conductive connecting member from getting wet.

According to yet another aspect of the invention, a method for fabricating a semiconductor light-emitting device can include: (a) preparing a light-emitting element substrate having a first conductivity type nitride semiconductor layer, a nitride semiconductor light-emitting layer, and a second conductivity type nitride semiconductor layer which are formed above a transparent substrate, the second conductivity type being opposite to the first conductivity type; (b) forming a notch region by performing selective etching to entirely cut the second conductivity type nitride semiconductor layer and the nitride semiconductor light-emitting layer in a thickness direction and to partially remove the first conductivity type nitride semiconductor layer, the notch region defining a plurality of mesa active regions and a mesa electrode drawing region; (c) forming an electrode for the first conductivity type extending from a region on the first conductivity type nitride semiconductor layer that is exposed in the notch region surrounding the plurality of mesa active regions to a region on the mesa electrode drawing region; and (d) forming an electrode for the second conductivity type on the second conductivity type region of the mesa active regions.

The method can further include (e) forming a first wiring for the first conductivity type and a second wiring for the second conductivity type on a supporting substrate, forming a conductive connecting member for the first conductivity type that is opposed to and connected to the electrode for the first conductivity type on the mesa electrode drawing region, and a conductive connecting member for the second conductivity type that is opposed to and connected to the electrode for the second conductivity type; and aligning the supporting substrate onto the transparent substrate to connect the electrode for the first conductivity type and the electrode for the second conductivity type to the connecting member for the first conductivity type and the connecting member for the second conductivity type, respectively.

In (c), the electrode for the first conductivity type may be formed to form ohmic contact with the first conductivity type region; and in (d) the electrode for the second conductivity type may be formed to form ohmic contact with the second conductivity type region.

In (f), a eutectic may be formed.

In (b), etching may be performed to form the notch region for defining the mesa active regions arranged in a matrix.

In (b), etching may be performed to form the notch region for defining the mesa active regions arranged in a matrix within a rectangular light-emitting region, and to define the mesa electrode drawing region arranged in the outside of each corner of the rectangular light-emitting region.

In (b), etching may be performed to form the notch region for defining the mesa active regions and the mesa electrode drawing region arranged in a matrix within a rectangular region. In this case, the mesa electrode drawing region may be arranged in each corner of the rectangular region. Furthermore, in (c), an alignment mark may be formed as a region in which no electrode is selectively formed on the mesa electrode drawing region.

In accordance with another aspect, the method may further include (g) forming a protection layer provided above the transparent substrate in such a manner that the electrode for the first conductivity type and the electrode for the second conductivity type are exposed on the mesa electrode drawing region and the ohmic electrode portion for the first conductivity type at the notch region is covered therewith, the protection layer preventing the melted connecting member from getting wet.

Accordingly, a plurality of mesa active regions that are surrounded by a notch region can be formed in a light-emitting region. One of the electrodes can be formed in the notch region surrounding the respective mesa active regions, and the other electrode can be formed on each mesa active region. Therefore, it is possible to efficiently supply a current to all positions in the light-emitting region with low resistance.

BRIEF DESCRIPTION OF THE DRAWINGS

These and other features and advantages of the invention will become clear from the following description with reference to the accompanying drawings, wherein:

FIGS. 8A to 8E are cross sectional views and plan views for explaining the configuration of another embodiment of a semiconductor light-emitting device made in accordance with the principles of the invention;

FIGS. 9A to 9D are explanatory views for a semiconductor bonding process;

FIGS. 10A and 10B are explanatory views showing the relationship between an applied load and an adhering area for a semiconductor fabrication process;

FIGS. 11A to 11D are explanatory views each including a plan view and a cross sectional view showing a relationship between a designed adhering area and an actual adhering area;

FIGS. 12A to 12C are explanatory views each including a plan view and a cross sectional view showing a relationship between a light-emitting section and a rated current;

FIGS. 13A to 13C are explanatory cross-sectional views showing a contact angle and a surface tension; and FIGS. 14A to 14C are explanatory cross-sectional views showing the provision of a nonwettable protection layer.

DETAILED DESCRIPTION OF PREFERRED EMBODIMENTS

Embodiments of the present invention are now described, with reference to the drawings.

Figure 2A:
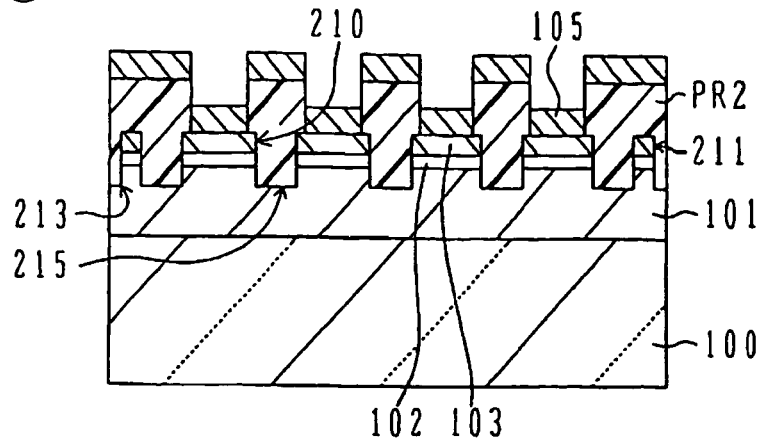
FIGS. 2A to 2C are cross sectional views and a plan view for explaining the fabrication of the semiconductor light-emitting device of FIGS. 1A-C, respectively.
Figure 2B:
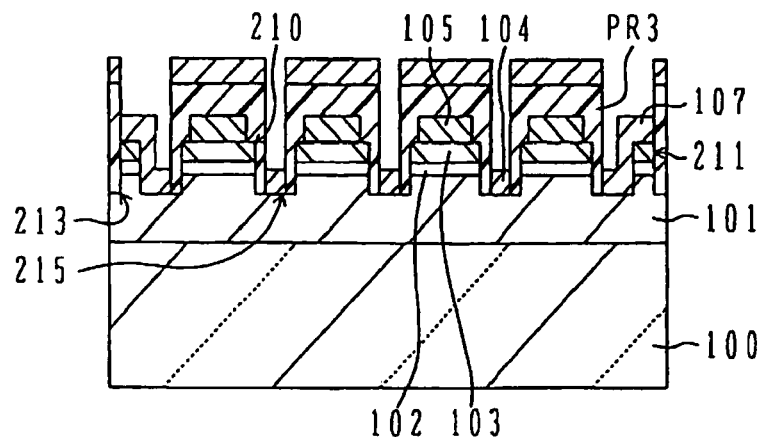
Figure 2C:
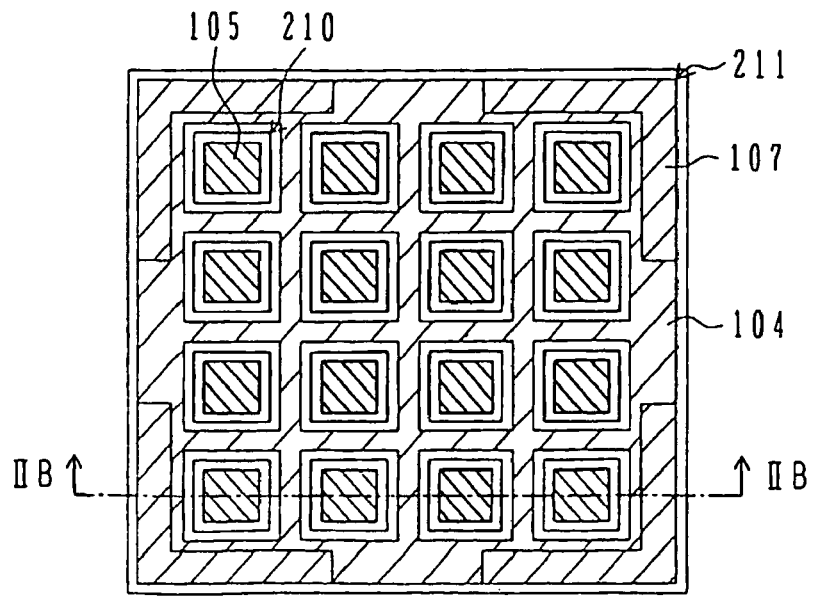
Figure 3:
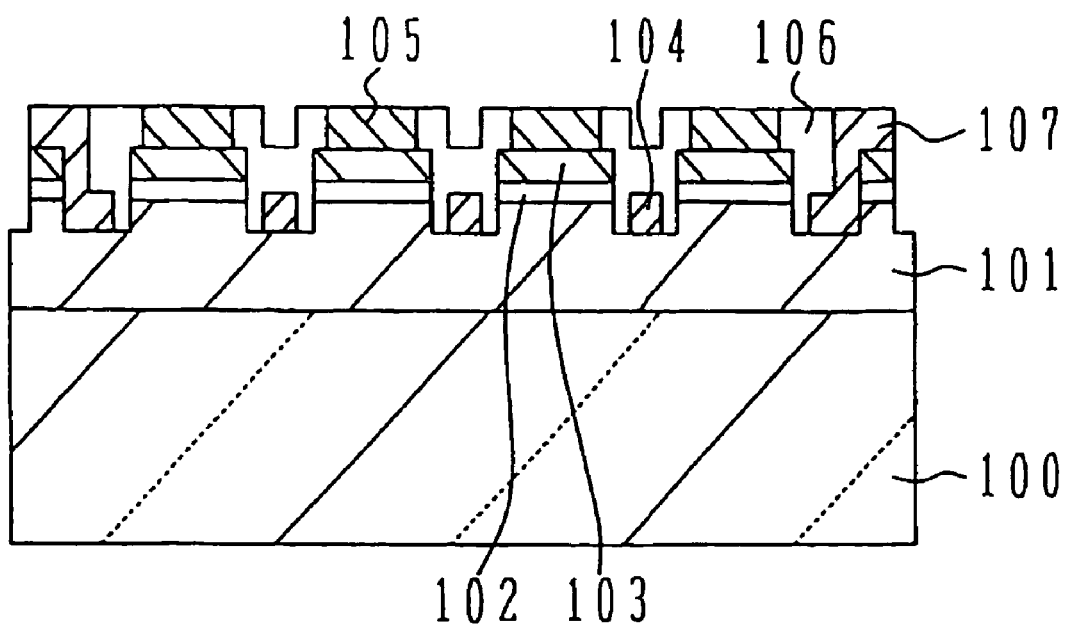
FIG. 3 is a cross sectional view for explaining the fabrication of the semiconductor light-emitting device of FIGS. 1A-C.
Figure 4A:
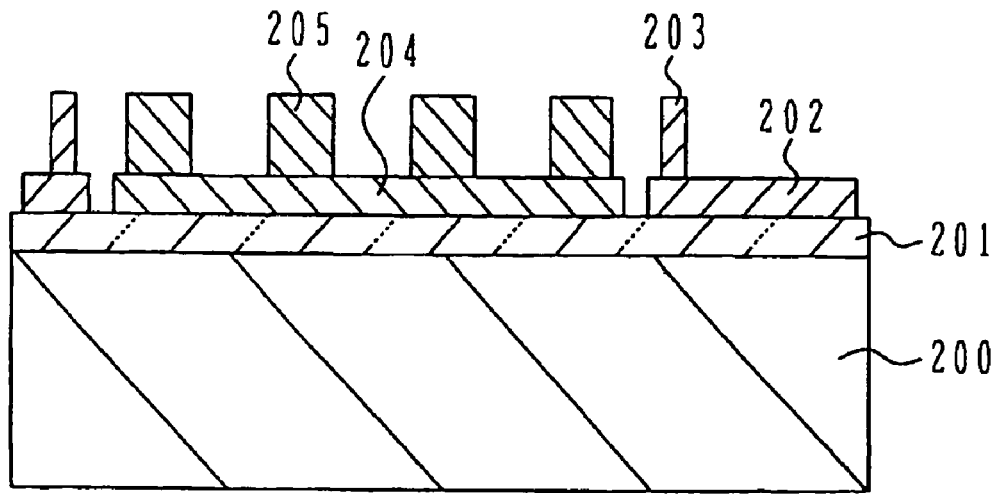
FIGS. 4A and 4B are a cross sectional view and a plan view for explaining the fabrication of the semiconductor light-emitting device of FIGS. 1A-C, respectively.
Figure 4B:
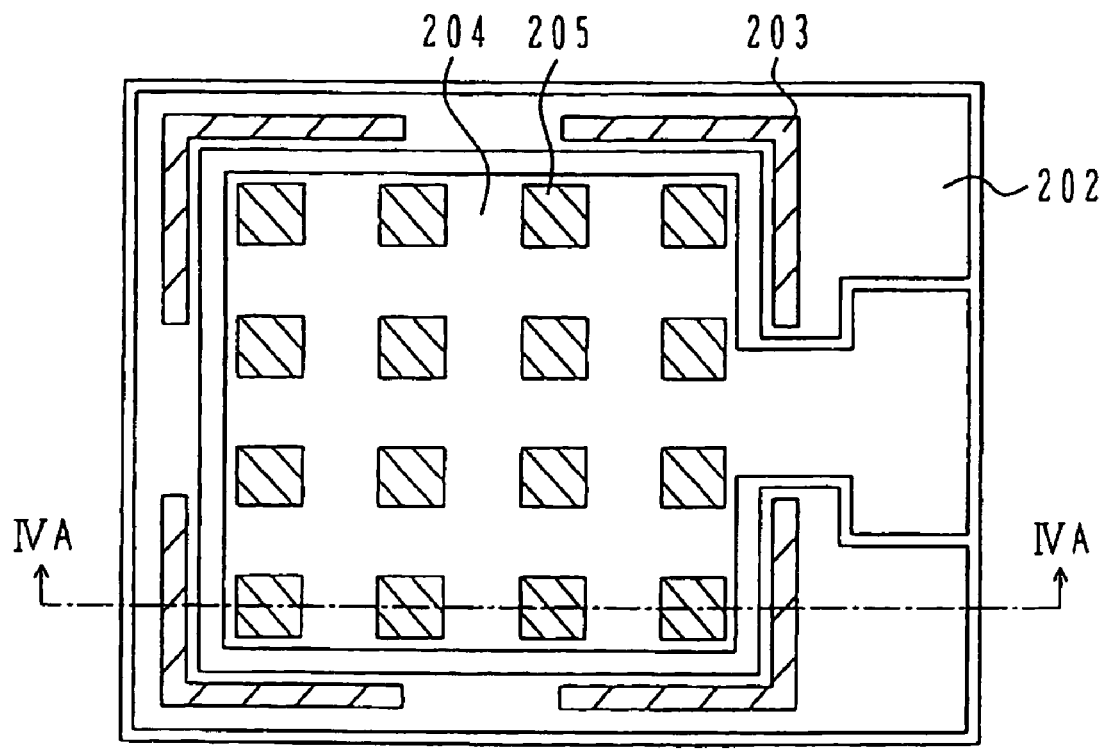
Figure 5A:
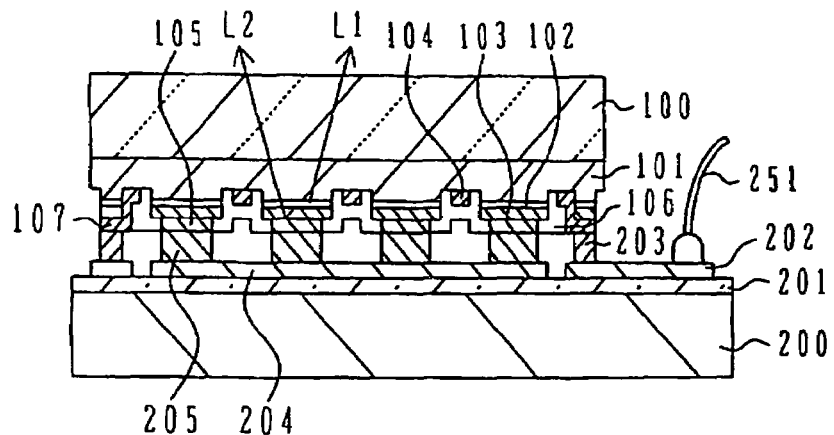
FIGS. 5A to 5C are cross sectional views and a plan view for explaining the fabrication of the semiconductor light-emitting device of FIGS. 1A-C, respectively.
Figure 5B:
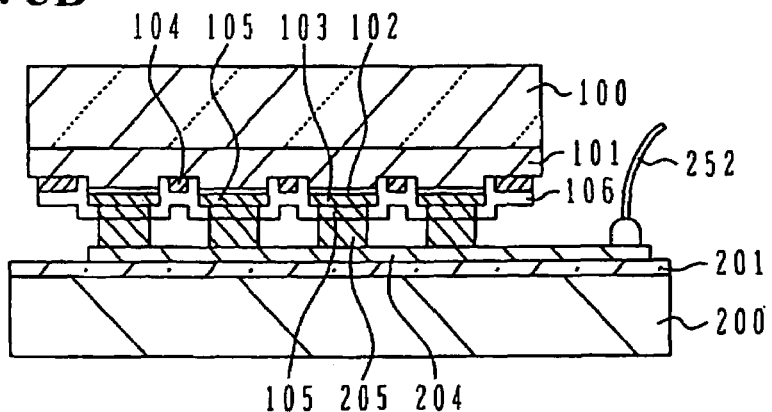
Figure 5C:
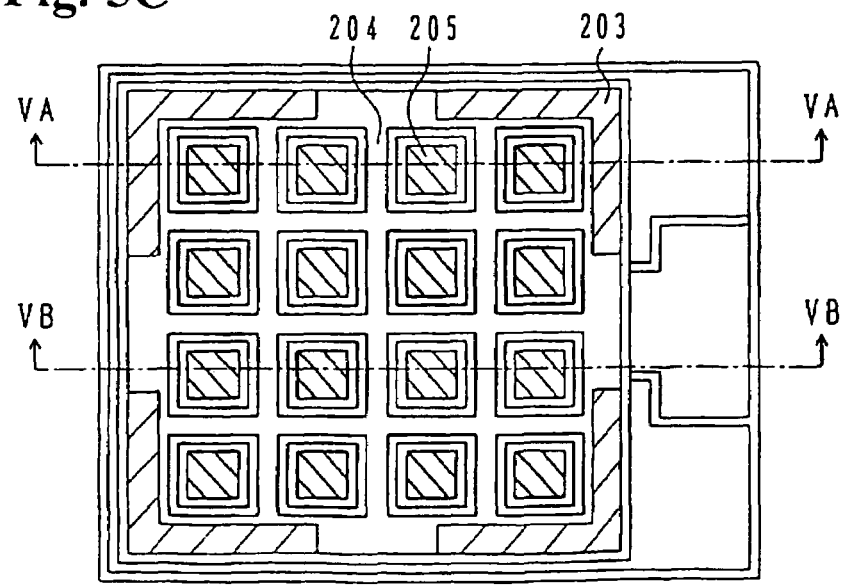

FIGS. 1A to 1C, 2A to 2C, 3, 4A, 4B, and 5A to 5C are cross-sectional views and plan views for explaining a fabrication method of a semiconductor light-emitting device according to an embodiment of the invention. More specifically, FIGS. 1A to 1C, 2A to 2C, and 3 are cross-sectional views and plan views of a semiconductor light-emitting element substrate. FIGS. 4A and 4B are a cross-sectional view and a plan view of a supporting substrate. FIGS. 5A to 5C are cross-sectional views and a plan view of the semiconductor light-emitting device in which the semiconductor light-emitting element substrate is bonded onto the supporting substrate.

Figure 1A:
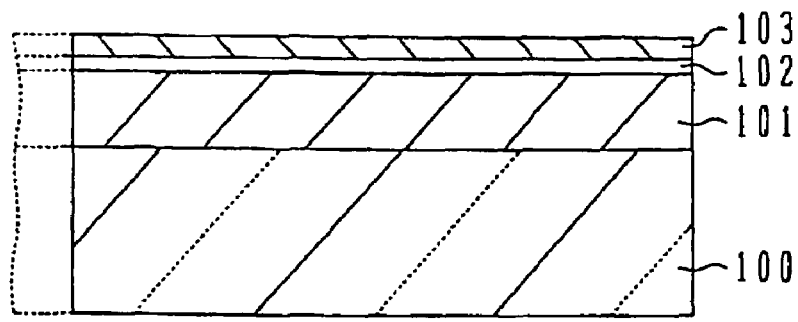
FIGS. 1A to 1C are cross sectional views and a plan view for explaining the fabrication of an embodiment of a semiconductor light-emitting device made in accordance with the principles of the invention, respectively.

As shown in FIG. 1A, a GaN nitride semiconductor layer can be formed on a surface of a sapphire substrate 100 by epitaxial growth. The epitaxial growth can be achieved by metal-organic-vapor-phase epitaxy (MOVPE) or molecular beam epitaxy (MBE), for example.

A buffer layer of GaN nitride semiconductor can be grown on the sapphire substrate 100 at a temperature lower than the temperature of the epitaxial growth, if necessary or desired. Then, a GaN n-type nitride semiconductor layer 101 can be formed by epitaxial growth at a temperature at which the epitaxial growth is possible. A GaN nitride semiconductor light-emitting layer 102 having a function of emitting light and a p-type GaN nitride semiconductor layer 103 doped with p-type impurities can be formed on the n-type nitride semiconductor layer 101 by epitaxial growth in that order. The total thickness of the light-emitting layer 102 and the p-type layer 103 can be 0.4 μm, for example.

The light-emitting layer may be formed by a single layer or may have a multiquantum well structure in which a barrier layer and a well layer are alternately formed. A spacer layer and the like may be further formed. Various known structures may be used as a multilayer structure for a light-emitting diode.

Figure 1B:
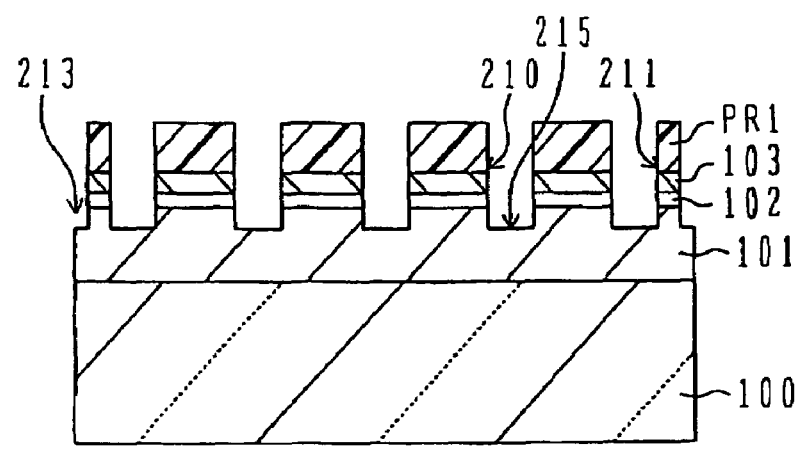

As shown in FIG. 1B, a photoresist pattern PR1 can be formed on a surface of the p-type layer 103 so as to cover mesa active regions 210 and mesa electrode drawing regions 211 and have an opening surrounding those regions 210 and 211.

Figure 1C:
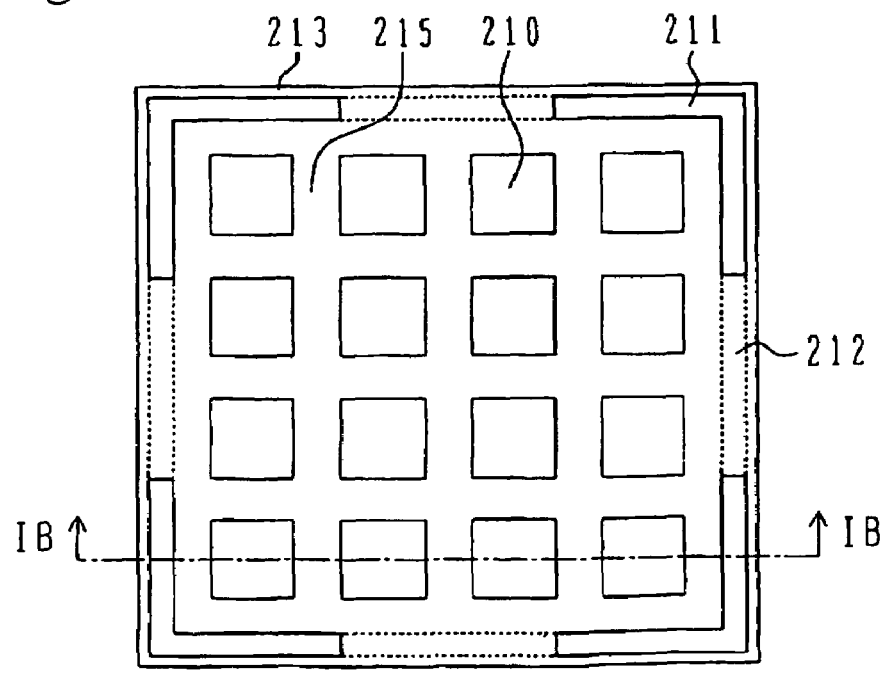

The mesa active regions 210 can be rectangular regions arranged in a matrix in a rectangular light-emitting region, as shown in FIG. 1C. The mesa electrode drawing region 211 can be an L-shaped region arranged in the outside of each corner of the rectangular light-emitting region. An opening can also be arranged outside the L-shaped region. Although FIG. 1C only shows part of a wafer corresponding to one chip, a number of chips can be arranged on the wafer in an actual fabrication process. The planar shape of the chip can be formed as a rectangle having a side of 1 mm, for example. The planar shape of the mesa active region can be a rectangle having a side of 180 μm, for example. A notch region 212 between the L-shaped regions 211 can have a length of 300 μm, for example. The area of each mesa active region can be set to 0.01 mm$^2$ (0.100 mm square) to 0.2 mm$^2$ (0.447 mm square).

All of the planar shapes described above can have rotational symmetries through 90 degrees. In a bonding process that can be performed later, positional alignment of the light-emitting element substrate can be achieved by rotation through an angle smaller than 90 degrees.

Reactive ion etching can be performed using the photoresist pattern PR1 as an etching mask, so as to substantially or entirely remove the p-type layer 103 and the light-emitting layer 102 and partially remove the n-type layer 101 in a thickness direction. Thus, a notch region including a trench 215 and an outer peripheral notch region 213 can be formed.

The depth of the notch region 213 and trench 215 can be set to 0.6 μm from the surface of the light-emitting element substrate, for example, and can be set to have a shape which extends through the p-type layer 103 and the light-emitting layer 102 can have a total thickness of 0.4 μm and partially enter the n-type layer 101.

A plurality of trenches 215 can be formed in two directions crossing each other, thereby defining m×n mesa active regions 210 arranged in a matrix, as shown in FIG. 1C. The outer peripheral notch region 213 can define, together with the outer most trenches 215, the mesa electrode drawing regions 211. The notch region can function to isolate each mesa active region from the mesa electrode drawing region and can therefore be called an isolation region in some cases.

The notch region 212 can be formed outside the center of each side of the rectangular light-emitting region. In the notch region 212, the mesa electrode drawing region can be removed. Therefore, the planar shape of the mesa electrode drawing region 211 can be L-shaped. This L-shape can be used as a mark for positional alignment. The notch region 212 can form the same plane together with the trench 215 and the notch regions 213 on both sides thereof. The notch region 212 can be opposed to a wiring region of a supporting substrate that will be described later and can be effective in preventing short-circuiting.

After the aforementioned etching, the photoresist pattern PR1 can be removed. In this manner, the notch region that includes the outer peripheral notch regions 213, the notch regions 212 between the mesa electrode drawing regions 211, and the trenches 215 defining the mesa active regions can be formed to have a uniform thickness. The mesa electrode drawing regions 211 can be at the same height (level) as the mesa active regions 210. When an n-side electrode formed on the n-type region 101 that is exposed in the trench 215 is made to continuously extend to a surface on the mesa electrode drawing region 211, the n-side electrode can be drawn up to the same height (level) as an electrode that is formed on the mesa active region 210.

As shown in FIG. 2A, a photoresist pattern PR2 can be formed on a surface of the substrate to have openings on the p-type layer 103, except for at regions around the mesa active regions. Then, a Pt (platinum) layer having a thickness of 1 nm, a Rh (rhodium) layer having a thickness of 100 nm, a Ti layer having a thickness of 100 nm, a Pt layer having a thickness of 100 nm, an Au layer having a thickness of 100 nm, a Pt layer having a thickness of 100 nm, and an Au layer having a thickness of 200 nm (hereinafter, referred to as Pt/Rh/Ti/Pt/Au/Pt/Au) can be formed by electron beam evaporation in that order. In this manner, a p-side electrode 105 can be formed on the p-type layer 103 in the mesa active region. The layers can also be formed on the photoresist pattern PR2. Then, the photoresist pattern PR2 can be removed together with the metal layers deposited thereon (liftoff), so that the p-side electrode 105 is left.

Then, a photoresist pattern PR3 can be formed on the substrate to have an opening that continuously extends from an electrode forming region on the n-type region 101 exposed in the trench 215 to an electrode forming region on the mesa electrode drawing region, as shown in FIG. 2B. Then, an Al layer having a thickness of 3 nm, an Rh layer having a thickness of 100 nm, a Ti layer having a thickness of 100 nm, a Pt layer having a thickness of 100 nm, an Au layer having a thickness of 100 nm, a Pt layer having a thickness of 100 nm, and an Au layer having a thickness of 200 nm (hereinafter, referred to as Al/Rh/Ti/Pt/Au/Pt/Au) can be deposited by electron beam evaporation in that order. Thus, an n-side ohmic electrode 104 located in the trench 215 and an n-side pad electrode 107 extending from the outermost trench to the electrode forming region on the mesa electrode drawing region 211 can be formed.

Then, the photoresist pattern PR3 can be removed and the metal layers deposited on the photoresist pattern PR3 can be lifted off. In this manner, the p-side electrodes and the n-side electrodes can be formed above the surface of the substrate above which the mesa active regions and the mesa electrode drawing regions have been formed. The Pt/Rh layers of the p-side electrode can be deposited mainly for forming ohmic contact with the semiconductor p-type region. The Pt/Rh layers that are in contact with or close to the surface of the semiconductor can be replaced with a single Rh layer, Pt/Ag layers, or Rh/Ag layers, for example. These layers can form ohmic contact with the p-type layer and can have high reflectivity with respect to light emitted from the light-emitting layer 102. The Ti layer of the p-side electrode can serve as an adhesive layer. In the case where the metal layers of the p-side electrode are successively deposited, the Ti layer may be omitted. For the Pt/Au/Pt/Au layers in an upper part of the p-side electrode, the thickness of each layer can be selected in accordance with a surface condition of a semiconductor light-emitting element to be used, adhesion with respect to the supporting substrate, and the like. In the case where the entire thickness of the electrode layers is changed, the thickness of the intermediate Au layer can be used for adjusting the thickness of the electrode layers. In the case where the eutectic bonding property is changed, the thickness of the Au layer that is located at the surface of the p-side electrode can be changed.

The Al/Rh layers of the n-side electrode can be formed mainly for forming ohmic contact with the n-type layer 101, and can be replaced with Al/Pt layers, Al/Ir layers, or Al/Pd layers, for example. The Ti layer of the n-side electrode can work in a similar manner as compared to the Ti layer of the p-side electrode. The Pt/Au/Pt/Au layers in an upper part of the n-side electrode can be adjusted in a similar manner as compared to the upper part of the p-side electrode. In the case where the n-side electrode is formed after formation of the p-side electrode, the level of the n-side electrode can be adjusted to be slightly higher or lower than that of the p-side electrode or to be at the same level as the p-side electrode. For example, in the case where a wafer warps and becomes convex toward the layers formed by epitaxial growth and therefore a level of a peripheral portion of the wafer is lower than that of a central portion, it is possible to set the height of the n-side electrode to be slightly higher than that of the p-side electrode so as to locate surfaces of both the n-side electrode and the p-side electrode on a flat plane. In the case where the wafer warps in an opposite direction, the height of the n-side electrode can be made slightly lower than that of the p-side electrode.

FIG. 2C shows a shape of the surface of the light-emitting element substrate above which the p-side electrodes 105, and the n-side electrodes 104 and 107 are formed. A cross section taken along line IIB-IIB in FIG. 2C is shown in FIG. 2B. The P-side electrode 105 can be formed in a central region of each mesa active region 210. The n-side ohmic electrode 104 can be formed at the center of the trench 215. The n-side pad electrode 107 can be formed to continuously extend from the outermost trench to the surface of the mesa electrode drawing region 211. A current can be supplied to the n-side pad electrode 107 arranged on the surface of the mesa electrode drawing region, and can then be supplied to respective light-emitting regions through the n-side electrode 104 that is formed to surround the mesa active regions. The p-side electrodes 105 can be formed directly on the surface of the mesa active regions and can supply current to the light-emitting regions, respectively.

Next, an SiO$_2$ layer 106 having a thickness of 100 to 300 nm can be deposited from above the substrate by sputtering, as shown in FIG. 3. Then, a resist pattern having openings above the p-side electrodes 105 and the n-side pad electrodes 107 can be formed and the SiO$_2$ layer 106 can be etched by wet etching. Thus, the p-side electrodes 105 and the n-side pad electrodes 107 can be exposed. The SiO$_2$ layer 106 can be a nonwettable protection layer that prevents a connecting material from getting wet in an electrode bonding process that can be performed later. The nonwettable protection layer can have an angle of contact of 90 degrees or more. Alternatively, a layer of Al$_2$O3, TiO$_2$, ZrO$_2$, HfO$_2$, or the like may be used as the nonwettable protection layer, other than the SiO$_2$ layer.

When a Ti layer having a thickness of about 1 to about 3 nm is formed on the surfaces of the p-side electrodes 105, the n-side electrodes 104 and 107 by evaporation, adhesion with the nonwettable protection layer can be enhanced. The Ti layer can also be etched during the wet etching of SiO$_2$. Thus, the Au layer can be exposed at the top surfaces of the exposed electrodes and pad electrodes. After formation of the electrodes is finished, the wafer including the light-emitting elements formed on the sapphire substrate can be ground and polished until the thickness of the wafer becomes about 100 µm. Then, scribing and breaking can be performed so as to separate individual light-emitting element substrates from each other. In this manner, the light-emitting element substrate can be formed.

Next, the supporting substrate portion of a light-emitting device is described. A single-crystal Si substrate can be used as the supporting substrate 200, for example, as shown in FIG. 4A. The single crystal Si substrate can be cleaned so as to clean its surface. Then, an SiO$_2$ layer 201 having a thickness of 300 nm can be deposited on the surface of the single-crystal Si substrate by sputtering. In the case when an Si substrate is used and on which a thermally-oxidized layer is formed as the supporting substrate 200, it may not be necessary to form the SiO$_2$ layer 201. In the case when an insulating substrate such as an AlN substrate is used as the supporting substrate 200, it may not be necessary to form an insulating protection layer on the surface of the supporting substrate 200.

A photoresist pattern can be formed on the surface of the substrate 200 in a region where no wiring is formed, and thereafter a Ti layer having a thickness of 10 nm and an Au layer having a thickness of 1000 nm (1 µm) can be deposited by electron beam evaporation. Then, the resist pattern can be removed and the metal layers that are deposited on the resist pattern can be lifted off. In this manner, an n-side wiring layer 202 and a p-side wiring layer 204 can be formed. The wiring layers 202 and 204 may be formed by Ni/Au layers, Al/Au layers, and the like, other than the Ti/Au layers.

The p-side wiring layer 204 can be continuously formed in a region corresponding to the light-emitting region at the central part of the chip, in which the mesa active regions are arranged, as shown in FIG. 4B. The n-side wiring layer 202 can be formed to have a shape connecting the mesa electrode drawing regions in the peripheral portion of the chip to each other.

Returning to FIG. 4A, a resist pattern can be formed to have openings in regions corresponding to contact portions of the light-emitting element substrates, and thereafter an Ni layer having a thickness of 10 nm, an Au layer having a thickness of 100 nm, a Pt layer having a thickness of 100 nm, a structure obtained by forming an Au layer having a thickness of 50 to 200 nm and an Sn layer having a thickness of 50 to 200 nm n times, and an Au layer having a thickness of 50 to 200 nm (hereinafter, referred to as Ni/Au/Pt/(Au/Sn)$_n$/Au) can be formed. Then, the resist mask can be removed together with the metal layers formed thereon. In this manner, n-side connecting members 203 and p-side connecting members 205 can be formed.

The p-side connecting member 205 can have a shape corresponding to the p-side electrode 105 on the mesa active region of the light-emitting element substrate. The n-side connecting member 203 can have a shape corresponding to the pad electrode 107 on the mesa electrode drawing region 211 of the light-emitting element substrate.

The thickness of each of the Au layers and the Sn layers in the (Au/Sn)$_n$ structure in the connecting members 203 and 205 can be determined considering a eutectic temperature and a eutectic process. For example, the thickness of the Au layer can be set to 75.6 nm, the thickness of the Sn layer can be set to 109.3 nm, and formation of the Au layer and the Sn layer can be repeated five times.

The stability in the case where the eutectic process is caused to occur after the above multilayer structure is deposited can be better than that in the case where eutectic metals are deposited by evaporation from the beginning. When composition ratios of Au and Sn (after they are melted) are Au:Sn=80:20 (wt %) (hereinafter, this material is referred to as Au/20Sn), a bulk ratio can be 0.544:0.456.

In the aforementioned structure, the number of the Au layers and the number of the Sn layers above the supporting substrate can be n+1 and n, respectively. Since there is one Au layer at the uppermost level of the electrodes of the light-emitting element substrate, the total number of the Au layers can be n+2.

While the light-emitting element substrate is placed face down on the supporting substrate, as shown in FIGS. 5A and 5B, flip-chip bonding can be performed. In this state, the p-side connecting member 205 of the supporting substrate is opposed to the p-side electrode 105 of the light-emitting element substrate, and the n-side electrode 107 on the mesa electrode drawing region of the light-emitting element substrate is opposed to the n-side connecting member 207 of the supporting substrate.

Then, the light-emitting element substrate and the supporting substrate can be bonded to each other by means of an eutectic bonding device. First, the light-emitting element portions can be aligned with the electrode pattern on the supporting substrate. Then, a pressure suitable for eutectic can be applied to those substrates. Finally, heating, temperature-keeping, and cooling can be performed in accordance with an appropriate eutectic profile, thereby bonding the light-emitting element substrate and the supporting substrate to each other. In the case where eutectic composition is Au/20Sn (wt %), the eutectic bonding can be performed at 280° C. to 330° C.

FIG. 5C is a plan view showing a state where the light-emitting element substrate is placed on the supporting substrate, seen from above. A cross section taken along line VA-VA is shown in FIG. 5A, and a cross section taken along line VB-VB is shown in FIG. 5B. A bonding region can be ensured on the right side of the light-emitting element substrate. In the bonding region, an n-side wire 251 can be bonded to the n-side wiring 202 and a p-side wire 252 can be bonded to the p-side wiring 204.

The thus obtained light-emitting element can be bonded to a frame, a wiring board, a heat sink, or a stem, for example. The bonding can be achieved by using Ag paste, solder, or eutectic, for example. The roughness of the polished surface of the supporting substrate can be adjusted in accordance with its use. For example, in case of using Ag paste, the adhesion may be better when the ground and polished surface of the supporting substrate is slightly rough. In case of using solder or eutectic, it may be preferable that the ground and polished surface of the supporting surface be a mirrored surface because Cu, Ag, Au, and Sn layers are formed on that surface.

The p-side electrode 105 can be formed on the top surface of each mesa active region 210 widely in its central part, and can form a contact with the p-side connecting member 205. Thus, a resistance associated with the p-side electrode can be lowered. Moreover, the n-side electrode can be formed on the surface of the trenches surrounding the mesa regions so as to surround the mesa regions. Thus, a current can be supplied from all the peripheral portions of the n-side electrode with a low resistance associated with the n-side electrode. In addition, the n-side electrode 104 can have high redundancy because it can be arranged in a lattice. Therefore, even if disconnection of the n-side electrode 104 occurs, an effect of the disconnection can be suppressed. Furthermore, since the n-side pad electrode 107 can be drawn up to the top surface of the mesa electrode drawing region 211 that has the same height as the mesa active regions 210, the n-side connecting member 203 and the p-side connecting member 205 of the supporting substrate can be formed to have the same layer structure. This can simplify the fabrication process. Furthermore, the entire resistance of the n-side wiring can also be reduced.

Referring to FIG. 5A, light L1 emitted upward from the light-emitting layer 102 can be transmitted through the n-type layer 101 and the transparent substrate 100 and can exit upward. Light L2 emitted downward from the light-emitting layer 102 can be reflected by the surface of the p-side electrode 105 upward, and can then be transmitted through the n-type layer 101 and the transparent substrate 100, and exit upward. In this manner, the light radiated from the light-emitting layer 102 can be directed upward efficiently.

An exemplary design for the multilayer structure for forming eutectic is now described.

Structure
Layers of connecting member: $(Au/Sn)_n/Au$
Surface layer of pad electrode: Au
Number of repetitions: n
Total number
Number of Au layers: n+2
Number of Sn layers: n
Thickness
Total thickness: Lt
Bulk ratio of Au: Dau (0.544 in case of Au/20Sn)
Bulk ratio of Sn: Dsn (0.456 in case of Au/20Sn)
Note: It was found from measurement that tin deposited by sputtering was gray tin. Therefore, the bulk ratio was calculated assuming that the density was 5.76 (g/cm$^3$).
Thickness of Au layer: Lau=Lt*Dau/(n+2)
Thickness of Sn layer: Lsn=Lt*Dsn/n
Thickness of eutectic member: Lst=Lau*(n+1)+Lsn*n
Thickness of Au layer at pad surface: Lpd=Lau When the total thickness of the eutectic metal layers is 1200 nm and the number of repetitions n is 5, for example, the number of Au layers is 7, the thickness of a single Au layer is 93.3 nm, the number of Sn layers is 5, and the thickness of a single Sn layer is 109.3 nm. Therefore, the entire thickness of the connecting member is 1106.7 nm, and the minimum thickness of the Au layer at the electrode surface of the light-emitting element substrate opposed to the connecting member is set to 93.3 nm or more.

In addition, the minimum thickness of the Au layer at the electrode surface of the light-emitting element substrate can be fixed to 200 nm in order to improve the adhesion. In this case, the respective thickness is as follows.

Total thickness: Lt=1200 nm
Thickness of Au layer at pad surface: Lpd=200 nm
Number of repetitions: n=5
Thickness of Au layer in eutectic member: Laust=(Lt*Dau−200)/(n+1)≈75.6 nm.
Thickness of Sn layer in eutectic member: Lsnst=Lt*Dsn/n≈109.3 nm
Thickness of eutectic member: Lst=Laust*(n+1)+Lsnst*n≈453.6 nm+546.5 nm≈1000 nm In this manner, the adhesion can be improved by setting the Sn ratio in the connecting member to be apparently larger than the eutectic ratio, because the Au layer at the surface of the electrode layer of the light-emitting element opposed to the connecting member may melt when the connecting member melts.

The above-described exemplary embodiment has the following features.

(1) Light-emitting surfaces are arranged in an array in the central region of the chip with high density and the n-side electrode pads are arranged in the outer peripheral region. Therefore, high luminance can be achieved, and point-like light emission can be performed when the appearance is observed.

(2) The function of the n-side ohmic electrode is separated from the function of the n-side electrode pad. Therefore, it is possible to make the line width of the n-side ohmic electrode in the light-emitting surface as narrow as possible. Moreover, the luminance distribution in the light-emitting surface can be made uniform.

(3) Even if the light-emitting area as a whole is increased, a current can be uniformly supplied to all the light-emitting elements that are sectioned. Moreover, damage to wirings such as disconnection can be suppressed by employing a lattice-like electrode structure.

(4) It is possible to arrange a plurality of n-side electrode pads in the outer peripheral region of the light-emitting element. Therefore, imperfect bonding to the supporting substrate can be suppressed.

(5) The light-emitting element substrate and the supporting substrate can adhere to each other in all the light-emitting surfaces due to the nonwettable protection layer. Moreover, a high heat dissipation property, high injection, and high output can be achieved.

(6) The lattice-like n-type ohmic electrode wiring and plurality of n-side electrode pads that are provided in the outer peripheral region can improve the redundancy against disconnection and prevent a feeding failure.

(7) The p-type ohmic electrodes (p-side electrode pads) that are arranged in the n×m mesa active regions can largely improve the adhesion with the connecting members of the supporting substrate.

(8) The nonwettable protection layer is formed to cover regions other than the p-type ohmic electrodes (p-side electrode pads) and the n-side electrode pads. Thus, the connecting member can have a self-coverage function, an area keeping function, and a self-pull up function.

In this manner, a semiconductor light-emitting element with ultra-high luminance and ultra-high output can be achieved. In addition, high reliability and long life can be achieved. Moreover, it is also possible to provide a fabrication method that enables stable fabrication of the light-emitting element.

In the above embodiment, it is described that the mesa electrode drawing region can be used as a mark for positional alignment. However, the alignment mark can be formed more willingly.

Figure 6A:
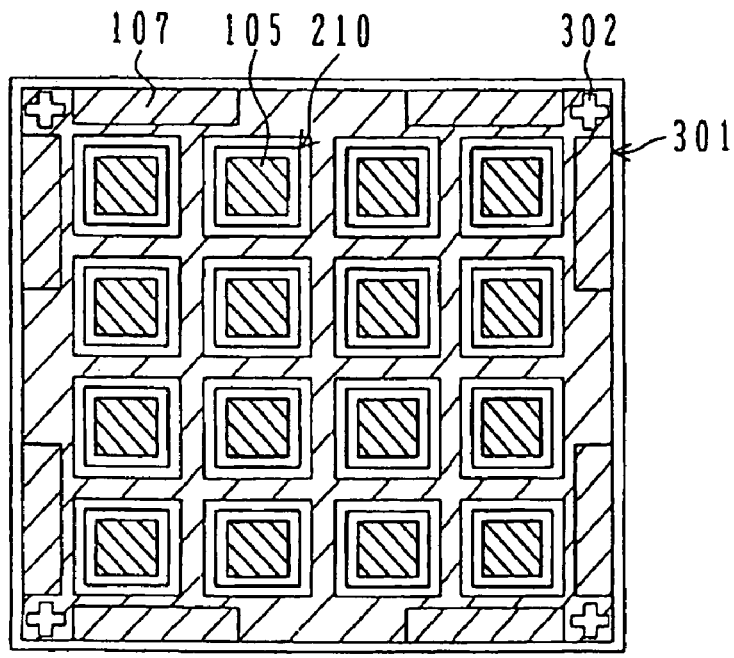
FIGS. 6A and 6B are plan views for explaining another embodiment of a semiconductor device made in accordance with the principles of the invention.
Figure 6B:
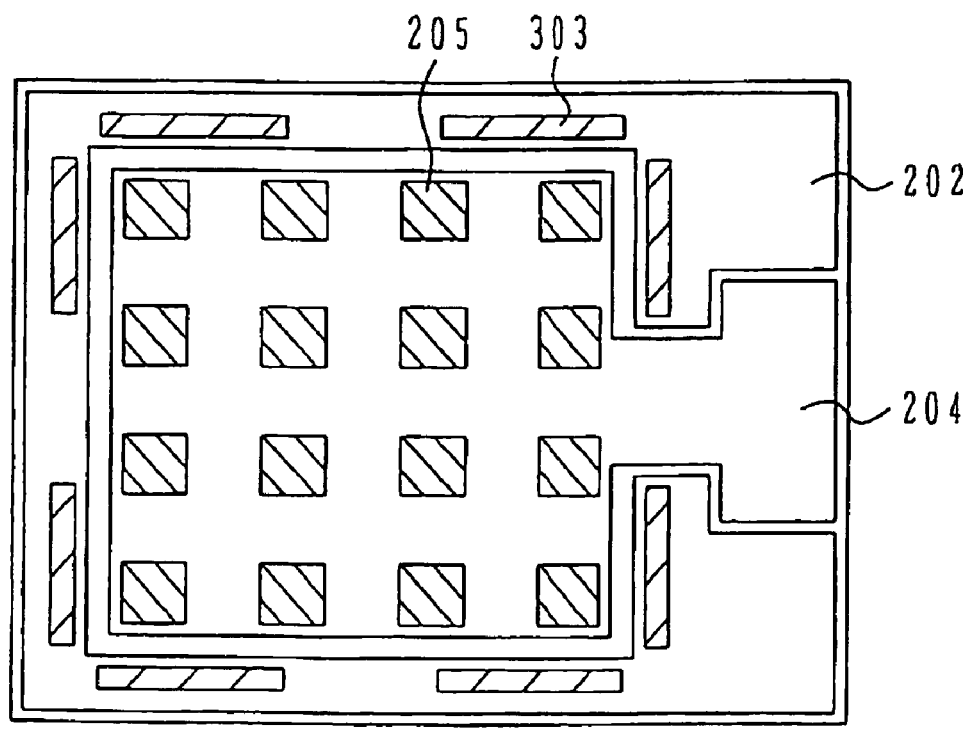

FIGS. 6A and 6B show an exemplary modification in which the alignment mark is formed. FIG. 6A is a plan view of the light-emitting element substrate corresponding to FIG. 2C, and FIG. 6B is a plan view of the supporting substrate corresponding to FIG. 4B. A mesa electrode drawing region 301 is not L-shaped but has a shape in which a corner is removed. A cut pattern 302 in which no n-side electrode is formed can be formed on the surface of the notch region at each corner. This cut pattern 302 can serve as a pattern for positional alignment. The supporting substrate shown in FIG. 6B can include a connecting member 303 having a shape corresponding to the mesa electrode drawing region 301. Alternatively, the supporting substrate having the structure shown in FIG. 4B can be used.

The alignment mark can be formed on the light-emitting element substrate by performing dry etching using a resist mask that has openings in regions at corners where the alignment marks are to be formed, respectively, and then performing deposition of the n-side electrode by evaporation and a liftoff process using the resist mask in which a cross shape is added to each region for the alignment mark.

The alignment mark 302 at each of four corners may have a shape which has different directions on an X-Y plane and has an intersection, such as a cross shape or an L-shape. Moreover, the shape of the alignment mark 302 may be a polygon or a circle having a diameter of about 100 μm to about 500 μm. The alignment mark enables precise detection of the position of the light-emitting element substrate by means of a camera of a eutectic bonder in a eutectic process performed for the light-emitting element substrate and the supporting substrate, and also enables bonding of those substrates to each other with high positional precision. Especially, in the case where the light-emitting element substrate in which a transparent semiconductor layer is deposited on a transparent substrate, it is possible to detect and determine the position of the light-emitting element substrate from the substrate side that is opposite to the electrode layer side.

In the embodiment of FIGS. 1A-C, the mesa active regions can be arranged in a matrix in the rectangular light-emitting region, and the mesa electrode drawing regions can be arranged outside the corners of the light-emitting region. However, the arrangement of the mesa regions is not limited thereto.

Figure 7A:
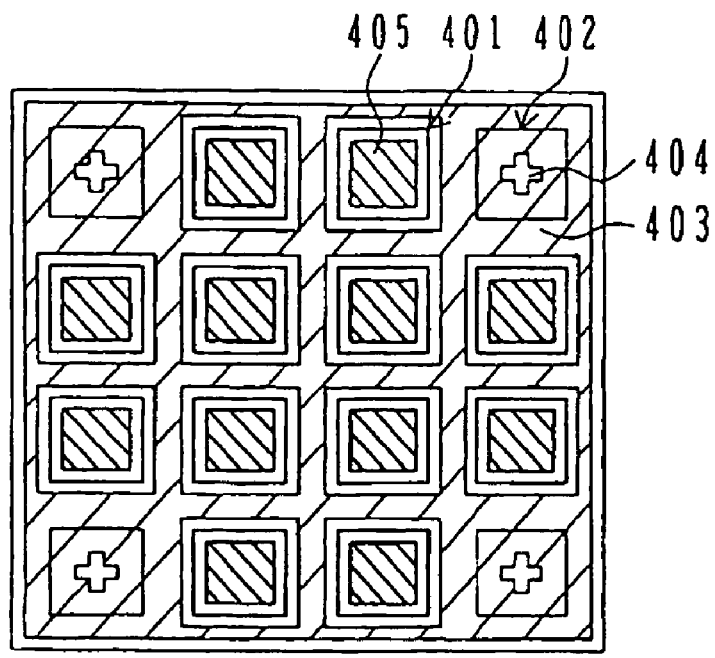
FIGS. 7A and 7B are plan views for explaining the configuration of another embodiment of a semiconductor light-emitting device made in accordance with the principles of the invention.
Figure 7B:
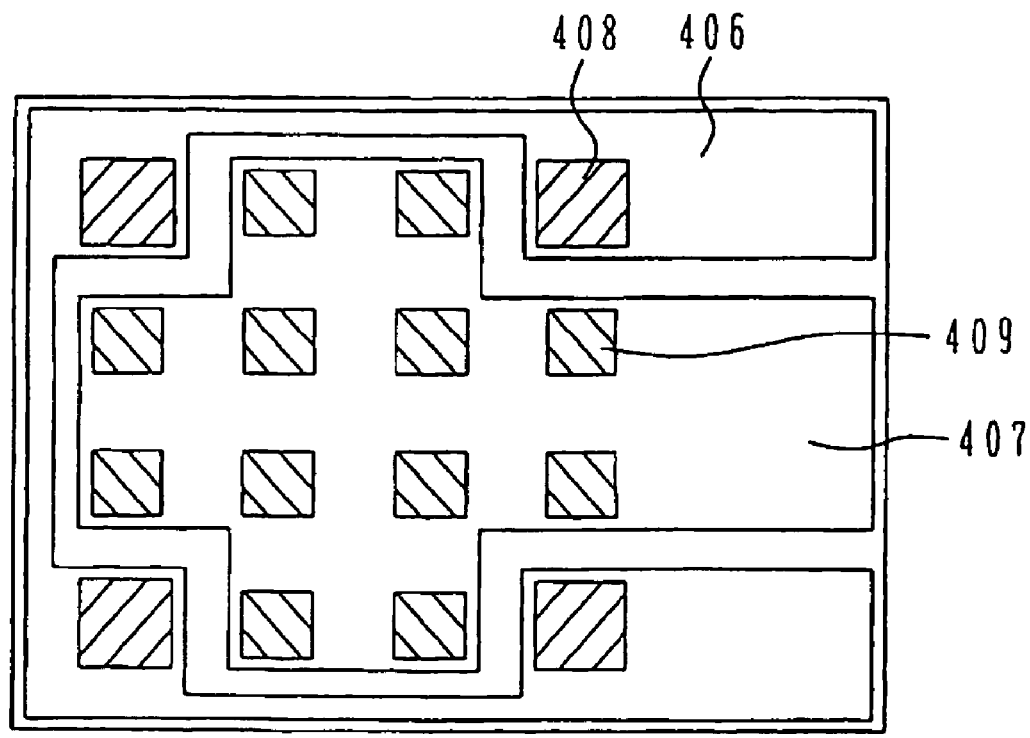

FIGS. 7A and 7B illustrate another embodiment of a semiconductor device made in accordance with the principles of the invention. A planar shape of a mesa active region 401 and that of a mesa electrode drawing region 402 can be the same rectangular shape, and can be arranged in a matrix in a rectangular region, as shown in FIG. 7A. Reactive ion etching can be performed for a region other than those mesa regions, as in the embodiment of FIGS. 1A-C, thereby forming a notch region in which an n-type nitride semiconductor layer is exposed. An n-side electrode 403 can be formed to extend from the n-type nitride semiconductor layer in the notch region to a surface of the mesa electrode drawing regions 402 at four corners. P-side electrodes 405 can be formed on a p-type nitride semiconductor layer in the mesa active regions 401. An alignment mark having a cross shape can be formed on the n-side electrode 403 on the mesa electrode drawing region 402 at each corner.

FIG. 7B shows a planar shape of the supporting substrate. An n-side wiring layer 406 having a shape that can connect the mesa electrode drawing regions at the four corners, and a p-side wiring layer 407 having a shape that can connect the mesa active regions can be formed above a silicon substrate on which an insulating surface is formed. Connecting members 408 can be formed to be connected to the pad electrodes on the mesa electrode drawing regions 402. Connecting members 409 can be formed to be connected to the p-side electrodes on the mesa active regions 401. A protection layer can be formed to expose pad portions of the p-side electrodes 405 and the n-side electrodes 403.

Except for the above, the embodiment of FIGS. 7A-B can be constructed similarly to that of the embodiment of FIGS. 1A-C. The fabrication process can also be performed in a similar manner to that of the embodiment of FIGS. 1A-C. In the embodiment of FIGS. 7A-B, the mesas at four corners of the rectangular region can be used as the electrode drawing regions, and the n-side electrode pads can be formed on the mesas. However, the positions of the n-side electrode pads are not limited to the four corners. Moreover, the supporting substrate may have a size corresponding to one light-emitting element substrate or a size that allows a plurality of light-emitting element substrates to be bonded to that supporting substrate. The supporting substrate itself may serve as a stem, a horn-type stem, a wiring board, or the like.

The arrangement of the mesa regions is not limited to a matrix arrangement. In the case where the number of the mesa active regions is small, the planar shape of each mesa active region can be changed. Moreover, the substrate above which the nonwettable protection layer is provided is not limited to the light-emitting element substrate.

FIGS. 8A to 8E illustrate yet another embodiment of a semiconductor device made in accordance with principles of the invention. In the embodiment of FIGS. 8A-E, nonwettable protection layers can be provided on both a light-emitting element substrate and a supporting substrate. The number of mesa active regions can be 2. A shape of the mesa active region and a shape of a mesa electrode drawing region can be set to be rectangular.

FIGS. 8A and 8B are a cross-sectional view and a plan view of the light-emitting element substrate, respectively. As in the previously described embodiments, an n-type layer 501, a light-emitting layer 502, and a p-type layer 503 can be deposited from a GaN nitride semiconductor on a transparent single-crystal substrate 500. Those layers can be etched by reactive ion etching in a region other than mesa regions so as to leave the mesa active regions 510 and the mesa electrode drawing regions 511.

An n-side ohmic electrode 504 can be formed on the n-type layer 501 that is exposed in a notch region. An n-side pad electrode 507 can also be formed to continuously extend from the n-side ohmic electrode 504 to a surface of the mesa electrode drawing region 511. A p-side ohmic electrode 505 can be formed on the p-type layer 503 in each mesa active region 510. Then, an $SiO_2$ layer for covering the n-side ohmic electrode 504 and a space between the p-side ohmic electrode 505 and the n-side pad electrode 507 can be formed by liftoff using the photoresist mask and electron beam evaporation.

FIGS. 8C and 8D are a cross-sectional view and a plan view of the supporting substrate. An n-side wiring layer 552 and a p-side wiring layer 554 can be formed above a silicon substrate 550 on which an insulating layer 551 is formed. Then, an n-side connecting member 553 and a p-side connecting member 555 can be formed in accordance with electrode shapes in the mesa regions. An $SiO_2$ layer 570 can be formed by liftoff using the photoresist mask and electron beam evaporation so as to cover the n-side wiring layer 552, the p-side wiring layer 554, and a surface between the n-side connecting member 553 and the p-side connecting member 555. In this manner, the nonwettable protection layer can be formed on the supporting substrate, in addition to the light-emitting element substrate.

The light-emitting element substrate can be bonded onto the supporting substrate by flip-chip bonding, as shown in FIG. 8E. The electrodes 505 and 507 of the light-emitting element substrate can be substantially aligned with the connecting members 555 and 553 of the supporting substrate, respectively. Then, a pressure can be applied to those substrates and while they are heated, thereby forming eutectic. Except for the above, the embodiment of FIGS. 8A-E can be similar to the aforementioned embodiments.

In the case where the nonwettable protection layer is formed on each of the light-emitting element substrate and the supporting substrate, a melting area of the connecting member can be perfectly limited in the bonding process. Therefore, it is possible to achieve good adhesion even if a space between the electrodes is as narrow as several microns.

In the above described embodiments, the p-type ohmic electrodes can be formed in the n×m rectangular mesa active regions defined by a lattice-like notch (sectioning groove). The thickness of the connecting member layer that serves as a thermal resistance layer can be made very thin, i.e., about 0.3 to 3 µm, emphasizing the heat dissipation property. Some of the functional advantages of this structure during bonding of the p-type ohmic electrode that is divided into n×m pieces (that also serves as the p-side electrode pad) to the p-side connecting member of the supporting substrate, are described below.

It is assumed that a driving voltage is 3.3 V and external quantum efficiency is 15% when a current of 350 mA flows in a light-emitting element having a size of 1 mm$^2$. If an energy other than an energy used for light emission is simply used for generating heat, the density of heat flow rate can be about 98 k (W/m$^2$). That is, a large-current element can generate a large amount of heat. Therefore, it is important to sufficiently dissipate heat generated by the light-emitting element portion in order to allow the element to effectively function.

In the flip-chip type semiconductor light-emitting element, the heat generated in the light-emitting element portion can be transmitted to the p-type ohmic electrode, the p-side connecting member, the p-side drawing electrode, the supporting substrate, and an element mounting portion (including a frame, a stem, a wiring board, a heat sink, and the like), and then dissipated. In this description, it is assumed that the adhesion and the heat dissipation properties when the supporting substrate is mounted onto the element mounting portion are sufficient. The description is focused on a bonding state of the light-emitting element inside the semiconductor light-emitting element substrate to the supporting substrate.

FIGS. 9A to 9D, 10A, and 10B show a bonding process. After the positions of the supporting substrate and the light-emitting element substrate are aligned with respect to each other by means of a eutectic bonding device, a pressure can be applied to those substrates. When the substrates are heated, melting and a eutectic bond start from a contact point shown in FIG. 9A. The adhesion and eutectic bond can make progress as shown in FIGS. 9B, 9C, and 9D in that order. While the adhesion makes progress, the connecting member that is melted can flow into an adhering region. Therefore, a non-adhering region can be formed outside the adhering region, in which the connecting member is insufficient. Thus, only part of the p-type ohmic electrode adheres to the supporting substrate under a load that is smaller than an appropriate load, as shown in FIG. 10A. However, when the appropriate load is applied, the non-adhering region is eliminated, as shown in FIG. 10B, and the p-type ohmic electrode (p-side electrode pad) can entirely adhere to the supporting substrate through the connecting member, as show in FIG. 10B.

Referring to FIGS. 11A to 11D, a designed adhering area and an actual adhering area are described. The surface of the semiconductor light-emitting element wafer (i.e., the surface of the p-type nitride semiconductor layer) can have an unevenness of about 10 to about 30 nm. In some cases, that unevenness has a depth of about 70 to about 100 nm. That unevenness can be reflected in the electrode surface after the p-type ohmic electrode layer (p-side electrode pad) is formed. That unevenness can have a period of several microns to several hundreds of microns, when seen on a plain surface.

In the actual bonding process, the eutectic member can be concentrated at a site where melting and adhesion start due to the above unevenness, and the non-adhering region may not be eliminated even if a load is applied.

This phenomenon may not occur when the area of the p-type ohmic electrode (p-side electrode pad) is smaller than about 0.1 mm$^2$ (300 µm square), as shown in FIG. 11C, but may start to occur when the area of the p-type ohmic electrode is about 0.2 mm$^2$, as shown in FIG. 11B. When the area of the p-type ohmic electrode is about 0.4 mm$^2$, as shown in FIG. 11A, this phenomenon can be observed at a considerable number of locations.

However, the p-type ohmic electrode that becomes convex may be damaged when a load larger than a necessary load is applied. In this case, ohmic characteristics may be damaged or the performance of the resultant light-emitting element may deteriorate because of reduction of the reflectivity. Thus, the problem of the non-adhering region may not be able to be overcome only by adjustment of the load.

It may not be desirable to reduce the width of the trench from a certain width. Thus, when the size of the p-type ohmic electrode (p-side electrode pad) is largely reduced, the area of the rectangular mesa active region with respect to the element size (i.e., the light-emitting area) is also reduced. This may be disadvantageous in terms of the output of the element. Therefore, an area of about 0.01 mm$^2$ or more is practical. In addition, the shape of the p-type ohmic electrode (p-side electrode pad) can be circular, because the adhering region can expand to be circular. However, in case of the circular p-type ohmic electrode (p-side electrode pad), loss of the light-emitting area can be large. Therefore, a square shape is suitable.

In the elements shown in FIGS. 11A and 11B, the designed adhering area is not obtained, although electric connection is achieved. Since the adhering area is small, heat dissipation may not be sufficiently achieved on the supporting substrate side. Thus, thermal deterioration may occur early. However, since these defective elements may not be able to be detected by an appearance inspection (luminance characteristics), it may be desirable to perform a measurement of thermal resistance and an aging test for all the elements in order to detect them. Therefore, defective elements may be disadvantageous in terms of mass productivity, cost, and reliability. In contrast, the element shown in FIG. 11C can achieve excellent mass productivity, cost, and reliability characteristics.

In a large-area semiconductor light-emitting element shown in FIG. 11A, bonding using the connecting member or bumps on the pad side, as shown in FIG. 11D, can be performed in order to overcome the problems that occur with bonding. In this case, the bumps can have a thickness of about 30 to 50 µm at minimum. Therefore, a thermal resistance may become larger in the bumps and the heat dissipation property may deteriorate.

When the size of the p-type ohmic electrode (p-side electrode pad) is 0.2 mm$^2$ or less, the non-adhering region can be effectively eliminated and the adhesive characteristics may become binary, i.e., have an entirely adhering state and a state where adhering has not been performed yet. That is, an intermediate state where the adhesion is partially achieved, as shown in FIGS. 11A and 11B, may be eliminated. Therefore, a value of a rated current of the light-emitting element can be determined by checking the number of sections that emit light via an appearance inspection. When the size of the p-type ohmic electrode (p-side electrode pad) is 0.1 mm$^2$ or less, the above tendency becomes remarkable.

A light-emitting element that includes 9 sections and has a rated current of 360 mA, as shown in FIG. 12A, is considered as an example. When only 7 sections emit light in the inspection, as shown in FIG. 12B, the rated current of that element can be determined to be 280 mA. When 8 sections emit light, as shown in FIG. 12C, the rated current can be determined to be 320 mA.

As described above, it is possible to simply determine the rated current in accordance with the number of sections that emit light by setting the size of each of the n×m p-ohmic electrodes (p-side electrode pad) to 0.2 mm$^2$ or less. Therefore, the light-emitting elements of FIGS. 11A and 11B that are determined to be defective elements can be determined as good products at a different rank.

The embodiment of FIGS. 1A-C employs a structure in which the p-type ohmic electrodes can be respectively formed in the n×m mesa active regions defined by a lattice-like section groove and a structure in which the nonwettable protection layer can be formed in a region other than the n-side electrode pads formed in the outer peripheral portion and the p-type ohmic electrodes (p-side electrode pad). Moreover, the embodiment of FIGS. 1A-C employs a structure in which the heat dissipation property can be emphasized and the thickness of the connecting member layer of the supporting substrate, which can serve as a thermal resistance layer, can be very thin, i.e., about 0.3 to about 3 µm. Functional advantages of those structures during bonding are now described.

FIGS. 13A and 13B show wettability at a temperature (about 300° C.) at which the connecting member (Au/20Sn) is melted. The connecting member can have a small contact angle θ with respect to Au and can have good wettability, as shown in FIG. 13A. However, the contact angle θ of the connecting member may be large with respect to glass and the wettability may not be good, as shown in FIG. 13B. This state is commonly referred to as a state where the connecting member is balled up. The above relationship is described by the contact angle and surface tension (interfacial tension) shown in FIG. 13C. The relationship between the contact angle and the surface tension can be represented by Expression (1).

In other words, when the connecting member can get wet easily with respect to the contact surface, the connecting member that is melted can easily be spread on the contact surface. When the connecting member hardly gets wet, the melted connecting member may not spread.

Referring to FIGS. 14A and 14B, the actual bonding process is described. The electrode pad (Au) of the light-emitting element portion can be pressed against the connecting member (Au/20Sn) provided on the drawing electrode layer (Au) of the supporting substrate portion, as shown in FIG. 14A. The electrode pad can be slightly larger than the connecting member. Then, they can be heated at about 300° C. at which a eutectic member is melted, so that melting of the connecting member starts. The melted connecting member formed of Au/20Sn (wt %) can be spread on the surface of the drawing electrode formed of Au (i.e., gets wet). Simultaneously, an Au-rich layer having high viscosity can be formed by mixing of Au/20Sn and Au at an interface between them, and can suppress the spread of the connecting member. The connecting member that is in contact with the electrode pad formed of Au on the light-emitting element substrate can be spread on the electrode pad (gets wet), but may stop at a boundary surface between the connecting member and the protection layer having low wettability (self-coverage).

As shown in FIG. 14B, after the above process, the light-emitting element substrate portion and the connecting member can be bonded to each other. The shape of the bonded connecting member is determined by interfacial tensions at interfaces between the drawing electrode and the connecting member, between the atmosphere gas and the connecting member, and between the electrode pad and the connecting member, and a balance of cohesion and viscosity of the connecting member, or the like.

When a relatively large load is applied so that a force causes the connecting member to be spread on the interface between the electrode pad and the connecting member, as shown in FIG. 14C, the connecting member may converge within the electrode pad due to the nonwettable protection layer (area keeping), although the contact angle of the connecting member becomes large.

Moreover, even in the case where the supporting substrate and the light-emitting element substrate are misaligned slightly and the connecting member sticks out from the electrode pad to be located on the protection layer, the connecting member can be converged within the electrode pad due to the interfacial tension when being melted (self-pull up).

More specifically, if a width of a part of the connecting member that sticks out from the edge of the electrode pad is in a range from about 5 to about 15 µm, the connecting member may be repelled by the nonwettable protection layer and be converged within the electrode pad when being melted and bonded. However, the width of the part of the connecting member that sticks out from the edge of the electrode pad, which enables the connecting layer to be converged within the electrode pad when the connecting member is melted and bonded, may be changed in accordance with the materials and surface conditions of the electrode pad, the nonwettable protection layer, and the connecting member, because those factors affect the interfacial tension. In order to converge the connecting member within the electrode pad, it may be necessary to provide the nonwettable protection layer in such a manner that a sticking-out width of the nonwettable portion from the end of the electrode pad is about twice or three times an expected sticking-out width of the connecting member.

The aforementioned operation may work better when the electrode pad has an area of about 0.1 to 0.2 mm$^2$ or less and the thickness of the connecting member is in a range from 0.3 to 3 µm. As described above, the connecting member can be bonded to the entire surface of the electrode pad by arranging the nonwettable protection layer to surround the electrode pad. Thus, stable electric connection and heat dissipation to the supporting substrate, that follows the design, can be achieved.

While there has been described what are at present considered to be exemplary embodiments of the invention, it will be understood that various modifications may be made thereto, and it is intended that the appended claims cover all such modifications as fall within the true spirit and scope of the invention.

The invention can be applied to, for example, a semiconductor light emitting device (LED) including an LED device for emitting white light.

What is claimed is:

1. A semiconductor light-emitting device comprising:
a transparent substrate;
a first conductivity type nitride semiconductor layer formed above the transparent substrate;
a nitride semiconductor light-emitting layer formed above the first conductivity type nitride semiconductor layer;
a second conductivity type nitride semiconductor layer formed above the nitride semiconductor light-emitting layer, the second conductivity type being opposite to the first conductivity type;
a notch region having a depth such that the notch region cuts the second conductivity type nitride semiconductor layer and the nitride semiconductor light-emitting layer and exposes the first conductivity type nitride semiconductor layer, the notch region defining a plurality of mesa active regions and a mesa electrode drawing region;
an electrode for the first conductivity type including an ohmic electrode portion for the first conductivity type and a pad electrode portion for the first conductivity type, the ohmic electrode portion for the first conductivity type being formed on the first conductivity type nitride semiconductor layer that is exposed in the notch region surrounding the plurality of mesa active regions, the pad electrode portion for the first conductivity type continuously extending from the ohmic electrode portion for the first conductivity type to a region on the mesa electrode drawing region;
ohmic electrodes for the second conductivity type formed on the second conductivity type nitride semiconductor layer in the plurality of mesa active regions; and
a supporting substrate arranged to be opposed to the transparent substrate, the supporting substrate including a conductive connecting member for the first conductivity type that is opposed to and connected to the pad electrode portion for the first conductivity type, and a conductive connecting member for the second conductivity type that is opposed to and connected to the ohmic electrodes for the second conductivity type, wherein
the light-emitting region has a rectangular shape, and the mesa electrode drawing region is an L-shaped region arranged at the outside of each corner of the rectangular light-emitting region.

2. The semiconductor light-emitting device according to claim 1, wherein
the supporting substrate includes a first wiring corresponding to the first conductivity type nitride semiconductor layer and a second wiring corresponding to the second conductivity type nitride semiconductor layer, the second wiring configured to connect the plurality of mesa active regions with each other, the second wiring being drawn from a region facing to any of the central parts of sides of the rectangular light-emitting region to a region outside that corresponding to the light-emitting region.

3. The semiconductor light-emitting device according to claim 1, wherein
the mesa active regions and the mesa electrode drawing region are arranged on the transparent substrate in a matrix.

4. The semiconductor light-emitting device according to claim 3, wherein
the matrix forms a rectangular region, and
the mesa electrode drawing region is arranged at a corner of the rectangular region.

5. The semiconductor light-emitting device according to claim 1, wherein
the supporting substrate includes a first wiring corresponding to the first conductivity type nitride semiconductor layer and a second wiring corresponding to the second conductivity type nitride semiconductor layer, the second wiring configured to connect the plurality of mesa active regions with each other, the second wiring being drawn from a region facing to any of the central parts of sides of the rectangular light-emitting region to a region outside that corresponding to the light-emitting region.

6. A semiconductor light-emitting device comprising:
a transparent substrate;
a first conductivity type nitride semiconductor layer formed above the transparent substrate;
a nitride semiconductor light-emitting layer formed above the first conductivity type nitride semiconductor layer;
a second conductivity type nitride semiconductor layer formed above the nitride semiconductor light-emitting layer, the second conductivity type being opposite to the first conductivity type;
a notch region having a depth such that the notch region cuts the second conductivity type nitride semiconductor layer and the nitride semiconductor light-emitting layer and exposes the first conductivity type nitride semiconductor layer, the notch region defining a plurality of mesa active regions and a mesa electrode drawing region;
an electrode for the first conductivity type including an ohmic electrode portion for the first conductivity type and a pad electrode portion for the first conductivity type, the ohmic electrode portion for the first conductivity type being formed on the first conductivity type nitride semiconductor layer that is exposed in the notch region surrounding the plurality of mesa active regions, the pad electrode portion for the first conductivity type continuously extending from the ohmic electrode portion for the first conductivity type to a region on the mesa electrode drawing region;
ohmic electrodes for the second conductivity type formed on the second conductivity type nitride semiconductor layer in the plurality of mesa active regions; and
a supporting substrate arranged to be opposed to the transparent substrate, the supporting substrate including a conductive connecting member for the first conductivity type that is opposed to and connected to the pad electrode portion for the first conductivity type, and a conductive connecting member for the second conductivity type that is opposed to and connected to the ohmic electrodes for the second conductivity type,
the plurality of mesa active regions are arranged in a matrix in a light-emitting region;
the mesa electrode drawing region is arranged in a plurality of regions outside the light-emitting region,
the light-emitting region has a rectangular shape, and
the mesa electrode drawing region is arranged outside the rectangular light-emitting region and in a region other than regions corresponding to central parts of sides of the rectangular light-emitting region, wherein
the mesa electrode drawing region has a rectangular planar shape and is arranged outside a region corresponding to the central parts of the sides of the rectangular light-emitting region, and at regions near each corner of the rectangular light-emitting region.

7. The semiconductor light-emitting device according to claim 6, wherein the conductive connecting member has a thickness of 0.3 μm to 3 μm.

8. The semiconductor light-emitting device according to claim 7, wherein any one of the conductive connecting member for the first conductivity type and the conductive connecting member for the second conductivity type of the supporting substrate includes a metal layer with a high affinity to one of solder and eutectic bonding.

9. The semiconductor light-emitting device according to claim 8, further comprising:

a protection layer provided above the transparent substrate in such a manner that the pad electrode portion for the first conductivity type and the ohmic electrode portion for the second conductivity type are exposed and the ohmic electrode portion for the first conductivity type at the notch region is covered by the protection layer, the protection layer preventing at least one of the connecting member for the first conductivity type and the connecting member for the second conductivity type, when melted, from getting wet.

10. The semiconductor light-emitting device according to claim 6, wherein the supporting substrate includes a first wiring corresponding to the first conductivity type nitride semiconductor layer and a second wiring corresponding to the second conductivity type nitride semiconductor layer, the second wiring configured to connect the plurality of mesa active regions with each other, the second wiring being drawn from a region facing to any of the central parts of sides of the rectangular light-emitting region to a region outside that corresponding to the light-emitting region.

* * * * *